(12) United States Patent
Choi et al.

(10) Patent No.: US 10,002,788 B2
(45) Date of Patent: Jun. 19, 2018

(54) METHODS OF FABRICATING SEMICONDUCTOR DEVICES

(71) Applicant: Samsung Electronics Co., Ltd., Suwon-si, Gyeonggi-do (KR)

(72) Inventors: Kyungin Choi, Seoul (KR); Jaeran Jang, Suwon-si (KR); Yoonhae Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/145,924

(22) Filed: May 4, 2016

(65) Prior Publication Data

US 2016/0365274 A1 Dec. 15, 2016

(30) Foreign Application Priority Data

Jun. 15, 2015 (KR) ........................ 10-2015-0084318

(51) Int. Cl.
*H01L 21/336* (2006.01)
*H01L 21/768* (2006.01)
(Continued)

(52) U.S. Cl.
CPC .. *H01L 21/76825* (2013.01); *H01L 21/31155* (2013.01); *H01L 21/76805* (2013.01); *H01L 21/76889* (2013.01); *H01L 21/76895* (2013.01); *H01L 21/823814* (2013.01); *H01L 21/823821* (2013.01); *H01L 21/823871* (2013.01); *H01L 21/823878* (2013.01); *H01L 27/1104* (2013.01); *H01L 27/1116* (2013.01); *H01L 29/66545* (2013.01); *H01L 29/66636* (2013.01); *H01L 29/66795* (2013.01); *H01L 29/7848* (2013.01); *H01L 29/165* (2013.01)

(58) Field of Classification Search
CPC ......... H01L 21/31155; H01L 21/76805; H01L 21/76825; H01L 21/76889; H01L 21/76895; H01L 21/823814; H01L 21/823821; H01L 21/823871; H01L 21/823878; H01L 23/485; H01L 27/088; H01L 27/1104; H01L 27/11
USPC ......................................................... 438/283
See application file for complete search history.

(56) References Cited

U.S. PATENT DOCUMENTS 6,194,302 B1 2/2001 Shen
6,335,249 B1 * 1/2002 Thei ................. H01L 21/28518
257/E21.165

(Continued)

FOREIGN PATENT DOCUMENTS

JP 2011-003838 A 1/2011
KR 10-2002-0020507 A 3/2002
(Continued)

*Primary Examiner* — Duy T Nguyen
(74) *Attorney, Agent, or Firm* — Ward and Smith, P.A.

(57) ABSTRACT

Methods of fabricating a semiconductor device include forming a gate pattern on a substrate, forming spacers to cover both sidewalls of the gate pattern, forming an interlayer insulating layer to cover the gate pattern and the spacers, and forming contact holes to penetrate the interlayer insulating layer and expose sidewalls of the spacers. The forming of the spacers includes forming a spacer layer to cover the gate pattern and injecting silicon ions into the spacer layer. The spacer layer is a nitride-based low-k insulating layer, whose dielectric constant is lower than that of silicon oxide.

19 Claims, 24 Drawing Sheets

(51) Int. Cl.
*H01L 29/78* (2006.01)
*H01L 29/66* (2006.01)
*H01L 21/8238* (2006.01)
*H01L 27/11* (2006.01)
*H01L 21/3115* (2006.01)
*H01L 29/165* (2006.01)

(56) References Cited

U.S. PATENT DOCUMENTS

| | | |
|---|---|---|
| 6,342,449 B2 | 1/2002 | Miyakawa |
| 8,674,438 B2 | 3/2014 | Yang et al. |
| 2002/0102845 A1* | 8/2002 | Lee .................. H01L 21/26586 438/677 |
| 2005/0156237 A1* | 7/2005 | Grudowski ....... H01L 21/26586 257/346 |
| 2013/0029494 A1 | 1/2013 | Sasaki et al. |
| 2015/0221676 A1* | 8/2015 | Holt ................. H01L 29/66795 257/347 |
| 2015/0228730 A1* | 8/2015 | Yang .................... H01L 27/092 257/369 |

FOREIGN PATENT DOCUMENTS

| | | |
|---|---|---|
| KR | 10-2002-0048692 A | 6/2002 |
| KR | 20040061852 A | 7/2004 |
| KR | 2009 0088677 A | 8/2009 |
| KR | 2001 0027085 A | 4/2011 |
| KR | 2011-0078105 A | 7/2011 |

* cited by examiner

METHODS OF FABRICATING SEMICONDUCTOR DEVICES

CROSS-REFERENCE TO RELATED APPLICATIONS

This U.S. non-provisional patent application claims priority under 35 U.S.C. § 119 to Korean Patent Application No. 10-2015-0084318, filed on Jun. 15, 2015, in the Korean Intellectual Property Office, the entire contents of which are hereby incorporated by reference.

BACKGROUND OF THE INVENTION

Example embodiments of the inventive concept relate to a semiconductor device and methods of fabricating the same, and in particular, to a semiconductor device with field effect transistors and methods of fabricating the same.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, semiconductor devices with high reliability, high performance, and/or multiple functions may be realized. To satisfy these technical requirements, complexity and/or integration density of semiconductor devices may be increased.

SUMMARY

Example embodiments of the inventive concept provide a semiconductor device, in which field effect transistors with improved electric characteristics are provided.

Some example embodiments of the inventive concept provide methods of fabricating a semiconductor device in which field effect transistors with improved electric characteristics are provided.

According to example embodiments of the inventive concept, methods of fabricating a semiconductor device may include forming a gate pattern on a substrate, forming spacers to cover both sidewalls of the gate pattern, forming an interlayer insulating layer to cover the gate pattern and the spacers, and forming contact holes to penetrate the interlayer insulating layer and expose sidewalls of the spacers. The forming of the spacers may include forming a spacer layer to cover the gate pattern and injecting silicon ions into the spacer layer. The spacer layer may be a nitride-based low-k insulating layer, whose dielectric constant may be lower than that of silicon oxide.

In some embodiments, the injecting of the silicon ions may be performed such that the spacer layer has a silicon concentration ranging from 30 at % to 40 at %.

In some embodiments, the injecting of the silicon ions may be performed at a dose ranging from $1.0E14/cm^2$ to $1.0E16/cm^2$.

In some embodiments, the injecting of the silicon ions may be performed to form a first portion and a second portion in at least one of the spacers, the first portion may be positioned adjacent to the gate pattern, and the second portion may be spaced apart from the gate pattern with the first portion interposed therebetween. At least one of the contact holes may be formed to expose the second portion, and the second portion may have a silicon concentration higher than that of the first portion.

In some embodiments, an etch selectivity of the second portion with respect to the interlayer insulating layer may be higher than that of the first portion with respect to the interlayer insulating layer.

In some embodiments, the second portion may serve as an upper region of the spacer, and the second portion may be formed to have a top surface higher than that of the first portion.

In some embodiments, the second portion may be formed to have a thickness ranging from 2 nm to 20 nm.

In some embodiments, methods may further include forming source/drain regions at both sides of the gate pattern. The contact holes may be formed to be overlapped with the source/drain regions, when viewed in plan view.

In some embodiments, the forming of the spacers may further include forming an etch stop layer on the substrate to cover the spacer layer, and the injecting of the silicon ions may be performed after the forming of the etch stop layer.

In some embodiments, methods may further include forming trenches in the substrate to define active patterns and forming device isolation layers to fill the trenches. The active patterns may be formed to protrude between the device isolation layers, and the gate pattern may be formed to cross the active patterns.

In some embodiments, the gate pattern may be used as a sacrificial gate pattern. In this case, the method may further include a gate last process of replacing the gate pattern with a gate electrode.

According to example embodiments of the inventive concept, methods of fabricating a semiconductor device may include forming a pattern on a substrate and forming spacers to cover both sidewalls of the pattern. The forming of the spacers may include forming a spacer layer to cover the pattern and injecting silicon ions into the spacer layer. The injecting of the silicon ions may be performed to form a first portion and a second portion in at least one of the spacers, the first portion may be positioned adjacent to the pattern, and the second portion may be spaced apart from the pattern with the first portion interposed therebetween. The second portion may have a silicon concentration higher than that of the first portion.

In some embodiments, the spacer layer may be a nitride-based low-k insulating layer, whose dielectric constant is lower than that of silicon oxide. Here, an etch selectivity of the second portion with respect to an oxide-based insulating layer may be higher than that of the first portion with respect to the oxide-based insulating layer.

In some embodiments, the pattern may be used as a sacrificial gate pattern, and the method further include replacing the sacrificial gate pattern with a gate electrode, after the formation of the spacers.

In some embodiments, methods may further include forming source/drain regions at both sides of the sacrificial gate pattern, forming an interlayer insulating layer to cover the gate electrode, the spacers, and the source/drain regions, and forming contact holes to penetrate the interlayer insulating layer and expose the source/drain regions. At least one of the contact holes may be formed to expose the second portion.

Some embodiments of the present inventive concept include methods of fabricating a semiconductor device that include forming a gate pattern on a substrate, forming a spacer layer on sidewalls of the gate pattern that has a nitride-based low-k insulating layer that includes a dielectric constant that is lower than a dielectric constant of silicon oxide, injecting silicon ions into the spacer layer, forming an interlayer insulating layer on the gate pattern and the spacer layer and forming contact holes that penetrate the interlayer insulating layer and expose sidewalls of the spacer layer.

In some embodiments, injecting of the silicon ions is performed to provide that the spacer layer has a silicon concentration ranging from 30 at % to 40 at %. Some embodiments may further include forming spacers on the gate pattern by performing an anisotropic etching process on the spacer layer, the injecting of the silicon ions is performed to form a first portion and a second portion in at least one of the spacers, the first portion is positioned adjacent the gate pattern and the second portion is spaced apart from the gate pattern with the first portion interposed therebetween, at least one of the contact holes exposes the second portion, and the second portion has a silicon concentration that is higher than a silicon concentration of the first portion.

In some embodiments, a portion of the second portion serves as an upper region of the spacer, and the second portion has a top surface that is higher than a top surface of the first portion.

Some embodiments include forming source/drain regions at both sides of the gate pattern, wherein the contact holes overlap with the source/drain regions, when viewed in plan view; forming trenches in the substrate, the trenches defining active patterns; and forming device isolation layers that fill the trenches. In some embodiments, the active patterns protrude between the device isolation layers and the gate pattern crosses the active patterns.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
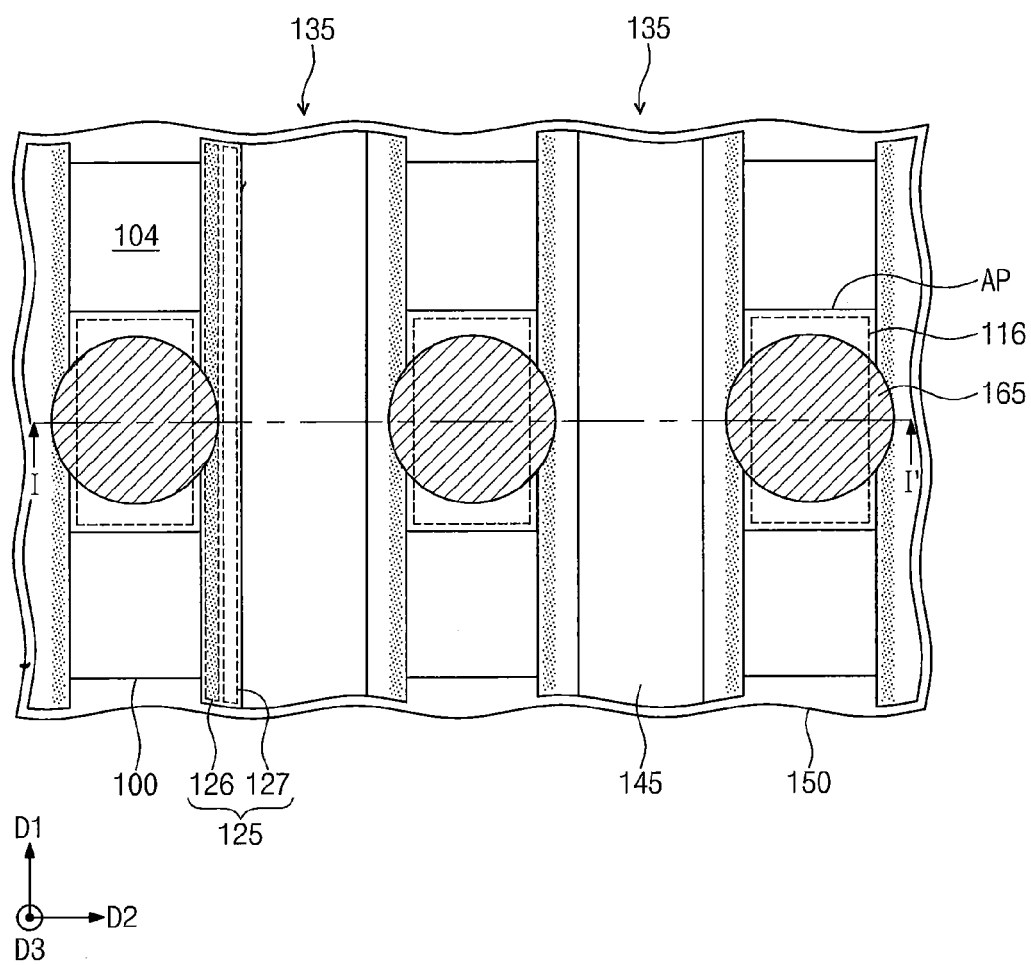
FIG. 1 is a plan view illustrating a semiconductor device according to example embodiments of the inventive concept.

It should be noted that these figures are intended to illustrate the general characteristics of methods, structures and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
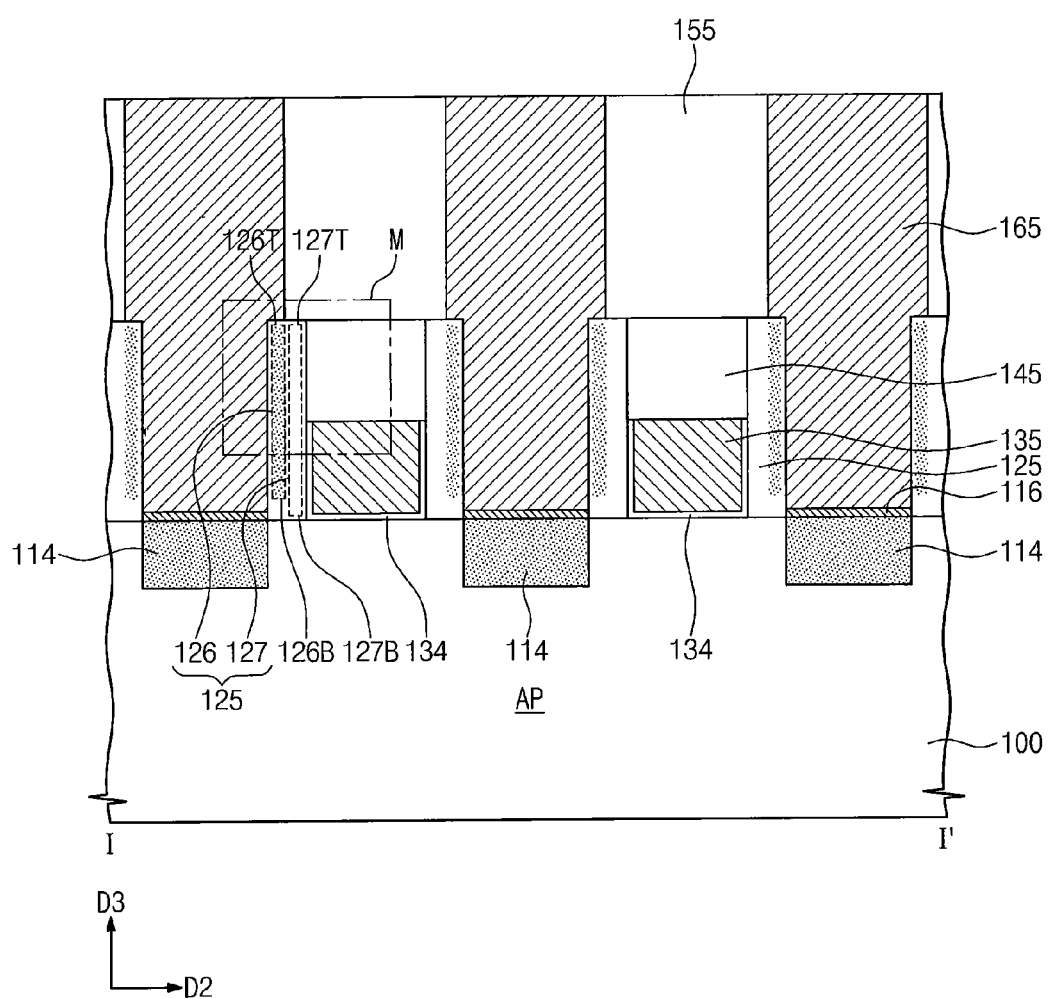
FIG. 2A is a sectional view taken along line I-I' of FIG. 1 to illustrate a semiconductor device according to example embodiments of the inventive concept.

FIG. 1 is a plan view illustrating a semiconductor device according to example embodiments of the inventive concept. FIG. 2A is a sectional view taken along line I-I' of FIG. 1 to illustrate a semiconductor device according to example embodiments of the inventive concept.

Referring to FIGS. 1 and 2A, a device isolation layer 104 may be provided on a substrate 100 to define an active pattern AP. The substrate 100 may be a semiconductor substrate (e.g., of silicon, germanium, or silicon-germanium) or a compound semiconductor substrate. In some embodiments, the device isolation layer 104 may include an insulating material, such as silicon oxide. The active pattern AP may correspond to a portion of the substrate 100 surrounded by the device isolation layer 104. The active pattern AP may be a line- or bar-shaped structure extending in a second direction D2 parallel to a top surface of the substrate 100. Although one active pattern AP is illustrated in FIGS. 1 and 2A, the substrate 100 may have a plurality of the active patterns AP. In this case, the active patterns AP may be arranged along a first direction D1 crossing the second direction D2. The active pattern AP may have a first conductivity type.

Gate electrodes 135 may be provided on the substrate 100. Each of the gate electrodes 135 may be a line- or bar-shaped structure crossing the active pattern AP and extending parallel to the first direction D1. In some embodiments, the gate electrodes 135 may be formed of or include at least one of doped semiconductors, conductive metal nitrides (e.g., titanium nitride and/or tantalum nitride), and/or metals (e.g., titanium, tantalum, tungsten, copper, and/or aluminum).

A plurality of gate electrodes 135 may be provided to cross at least one of the active patterns AP. For example, as illustrated in FIGS. 1 and 2A, a pair of gate electrodes 135 may be provided on each of the active patterns AP to extend in the first direction D1. Here, the pair of the gate electrodes 135 may be spaced apart from each other in the second direction D2. For the sake of simplicity, a pair of the gate electrodes 135 will be described as an example.

Spacers 125 may be provided on both sidewalls of each of the gate electrodes 135. The spacers 125 may extend along the gate electrodes 135 or parallel to the first direction D1. Each of the spacers 125 may have a top surface that is positioned at a higher level than those of the gate electrodes 135. Furthermore, the top surface of each of the spacers 125 may be coplanar with top surfaces of a first interlayer dielectric (ILD) layer 150 and/or each of gate capping layers 145, which will be described below. The spacers 125 may be formed of a nitride-based low-k insulating layer. The low-k insulating layer may have a dielectric constant lower than that of silicon oxide ($SiO_2$). In some embodiments, the spacers 125 may have a dielectric constant lower than those of first and second interlayer insulating layers 150 and 155, which will be described below. The spacers 125 may be formed of or include at least one of SiON, SiCON, and/or SiN. In the case where the spacers 125 include silicon nitride (SiN), the spacers 125 may be formed to have a porous structure and thereby to have a reduced dielectric constant. In the case where a low-k insulating layer is used as the spacer 125, it is possible to reduce parasitic capacitance between the gate electrode 135 and a contact 165.

Each of the spacers 125 may include a first portion 127 adjacent the gate electrode 135 and a second portion 126 adjacent the contact 165. The second portion 126 may be spaced apart from the gate electrode 135 with the first portion 127 interposed therebetween. The second portion 126 may be a doped region, which is formed by an ion implantation process IIP of injecting and diffusing silicon ions into the spacer 125. In some embodiments, a top surface 126T of the second portion 126 may be coplanar with a top surface 127T of the first portion 127. A bottom surface 126B of the second portion 126 may be higher than a bottom surface 127B of the first portion 127. The second portion 126 may have a thickness ranging from 2 nm to 20 nm. The second portion 126 may include the same material as the first portion 127. However, the second portion 126 may have a silicon concentration that is higher than that of the first portion 127. This is because, as will be described in more detail below, the silicon concentration of the second portion 126 is increased by an ion implantation process IIP. In detail, the second portion 126 may have a silicon concentration ranging from 30 at % to 40 at %. In more detail, the second portion 126 may have a silicon concentration ranging from about 33 at % to about 35 at %.

In some embodiments, an interface between the first portion 127 and the second portion 126 may be unclear. Here, when measured from a center of the spacer 125, the first portion 127 may be positioned adjacent the gate electrode 135, compared with the second portion 126, and the second portion 126 may be positioned adjacent to the contact 165, compared with the first portion 127.

In general, if a material (e.g., a low-k dielectric layer) has a low dielectric constant, it may exhibit a relatively bad etch-resistant property, when a specific etchant is used. In the case where, to reduce parasitic capacitance of a semiconductor device, a low-k dielectric material is used for the spacers 125, the spacers 125 may be easily removed, when the contacts 165 are formed. Accordingly, it may be difficult to use the spacers 125 to protect the gate electrodes 135, and thus, an electric short circuit may be formed between the contacts 165 and the gate electrodes 135. By contrast, according to example embodiments of the inventive concept, as a result of the silicon ion implantation process, the second portions 126 may have a silicon concentration higher than that of the first portions 127. This may make it possible for the second portions 126 doped with silicon ions to have a good etch resistant property in a subsequent etching process. For example, the second portions 126 may have a high etch selectivity with respect to the first and second interlayer insulating layers 150 and 155 (e.g., of an oxide-based material). Since the second portions 126 are formed of a material with a low dielectric constant, it is possible to improve an RC-delay property of the device, and moreover, the use of the second portions 126 may make it possible to protect the gate electrodes 135 from etch damage.

Gate dielectric layers 134 may be provided between the gate electrodes 135 and the substrate 100 and between the gate electrodes 135 and the spacers 125. The gate dielectric layers 134 may be formed of or include a high-k dielectric material. For example, the gate dielectric layers 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate capping layers 145 may be provided on the gate electrodes 135, respectively. The gate capping layers 145 may extend along the gate electrodes 135 or parallel to the first direction D1. The gate capping layers 145 may be formed of or include a material having an etch selectivity with respect to first and second interlayer insulating layers 150 and 155, which will be described below. For example, the gate capping layers 145 may be formed of or include at least one of SiON, SiCN, SiCON, and/or SiN. Furthermore, the gate capping layers 145 may include a material, whose dielectric constant is greater than that of the spacers 125. In a usual etching process, as a dielectric constant of a material increases, an etch rate thereof may decrease. Thus, in a subsequent etching process for forming the contacts 165, the gate capping layers 145 may make it possible to effectively protect the top portions of the gate electrodes 135.

Source/drain regions 114 may be provided in the active pattern AP positioned between the pair of gate electrodes 135 and at both sides of the pair of gate electrodes 135. The source/drain regions 114 may be epitaxial patterns formed by a selective epitaxial growth process. The source/drain regions 114 may have top surfaces, which are positioned at the same level as or at a higher level than the top surface of the active pattern AP. The source/drain region 114 is illustrated to have a flat top surface, but in certain embodiments, the source/drain region 114 may have a curved top surface with non-vanishing curvature. As an example, the source/drain regions 114 may upward convex top surfaces. Although not shown, bottom surfaces of the source/drain regions 114 may be positioned above the bottom surface of the device isolation layer 104.

The source/drain regions 114 may include a semiconductor element different from those of the substrate 100. For example, the source/drain regions 114 may be formed of or include a semiconductor material having a lattice constant different from (for example, greater or smaller than) the substrate 100. This may make it possible to exert a compressive stress or a tensile stress to a channel region defined in the active pattern AP and below the gate electrode 135. In the case where the substrate 100 is a silicon wafer, the source/drain regions 114 may be formed of or include a silicon-germanium (e.g., e-SiGe) and/or germanium layer. In this case, the source/drain regions 114 may exert a compressive stress on the channel regions (preferably, of PMOS field effect transistors). In the case where the substrate 100 is a silicon wafer, the source/drain regions 114 may be formed of or include a silicon carbide (SiC) layer. In this case, the source/drain regions 114 may exert a tensile stress on the channel regions (preferably, of NMOS field effect transistors). The compressive or tensile stress to be exerted on the channel region by the source/drains SD may make it possible for carriers in the channel regions to have an increased mobility, when the field effect transistors are operated. The source/drain regions 114 may have a second conductivity type that is different from that of the active pattern AP.

Although not shown, semiconductor capping patterns may be provided on the source/drain regions 114. The semiconductor capping patterns may include the same semiconductor element as the substrate 100 or the source/drain regions 114. As an example, the semiconductor capping patterns may be formed of or include silicon or silicon germanium. As another example, each of the semiconductor capping patterns may be a double-layered structure including a silicon layer and a silicon-germanium layer. In example embodiments, the semiconductor capping patterns may be doped with elements different from dopants contained in the source/drain regions 114. For example, in the case where the source/drain regions 114 include an e-SiGe layer, the semiconductor capping patterns may be formed of or include a lightly Ge-doped layer and/or a highly B-doped layer. This makes it possible to reduce contact resistance between the semiconductor capping patterns and the source/drain regions 114.

In some embodiments, metal silicide layers 116 may be respectively interposed between the source/drain regions 114 and the contacts 165. In other words, the contacts 165 may be electrically connected to the source/drain regions 114 via the metal silicide layers 116. The metal silicide layers 116 may be formed of or include at least one of metal-silicide materials (e.g., titanium silicide, tantalum silicide, and/or tungsten silicide). The metal-silicide materials may be formed through a chemical reaction between semiconductor elements contained in the source/drain regions 114 and metallic elements.

A first interlayer insulating layer 150 may be provided on the substrate 100. The first interlayer insulating layer 150 may have a top surface that is substantially coplanar with those of the spacers 125 and the gate capping layers 145. The first interlayer insulating layer 150 may be formed of or include a silicon oxide layer. A second interlayer insulating layer 155 may be formed on the first interlayer insulating layer 150 to cover the gate capping layers 145. The second interlayer insulating layer 155 may be formed of or include a silicon oxide layer and/or a low-k oxide layer. The low-k oxide layer may include, for example, a carbon-doped silicon oxide layer (e.g., SiCOH). Although not shown, a pad oxide (e.g., of silicon oxide) (not shown) may be further provided between the substrate 100 and the first interlayer insulating layer 150.

The contacts 165 may be provided on the substrate 100 to penetrate the second interlayer insulating layer 155 and the first interlayer insulating layer 150 and to be in contact with the metal silicide layers 116. At least one of the contacts 165 may be in direct contact with at least one of the spacers 125. The contacts 165 may be spaced apart from the gate electrodes 135 by the gate capping layers 145 and the spacers 125 and may be electrically connected to the source/drain regions 114. The contacts 165 may be formed of or include a metallic material (e.g., tungsten). In some embodiments, the contacts 165 may include a stack of a barrier metal layer (e.g., of metal nitride) and a metal layer (e.g., of tungsten).

Referring back to FIG. 1, when viewed in a plan view, the contacts 165 may be aligned with the source/drain regions 114. Each of the contacts 165 may include a portion that is not overlapped with the source/drain region 114, in the plan view. Accordingly, at least one of the contacts 165 may be partially overlapped with the second portion 126, in the plan view.

According to example embodiments of the inventive concept, a field effect transistor of a semiconductor device may include the gate capping layers 145, which are disposed to protect top portions of the gate electrodes 135, and the second portions 126 of the spacers 125, which are disposed to protect sidewalls of the gate electrodes 135. The gate capping layers 145 and the second portions 126 may have a high etch selectivity with respect to the first and second interlayer insulating layers 150 and 155, and thus, it is possible to effectively protect the gate electrodes 135 from an etch damage. This makes it possible to enlarge a process margin in a contact-hole etching process to be described below. Furthermore, by virtue of the gate capping layers 145 and the second portions 126, it is possible to form the contacts 165 in a self-aligned and effective manner, without a short between the contacts 165 and the gate electrodes 135, and to improve operation speed and characteristics of the semiconductor device. As a result, it is possible to provide a semiconductor device with improved performance and a fabrication process with an increased process margin.

Figure 2B:
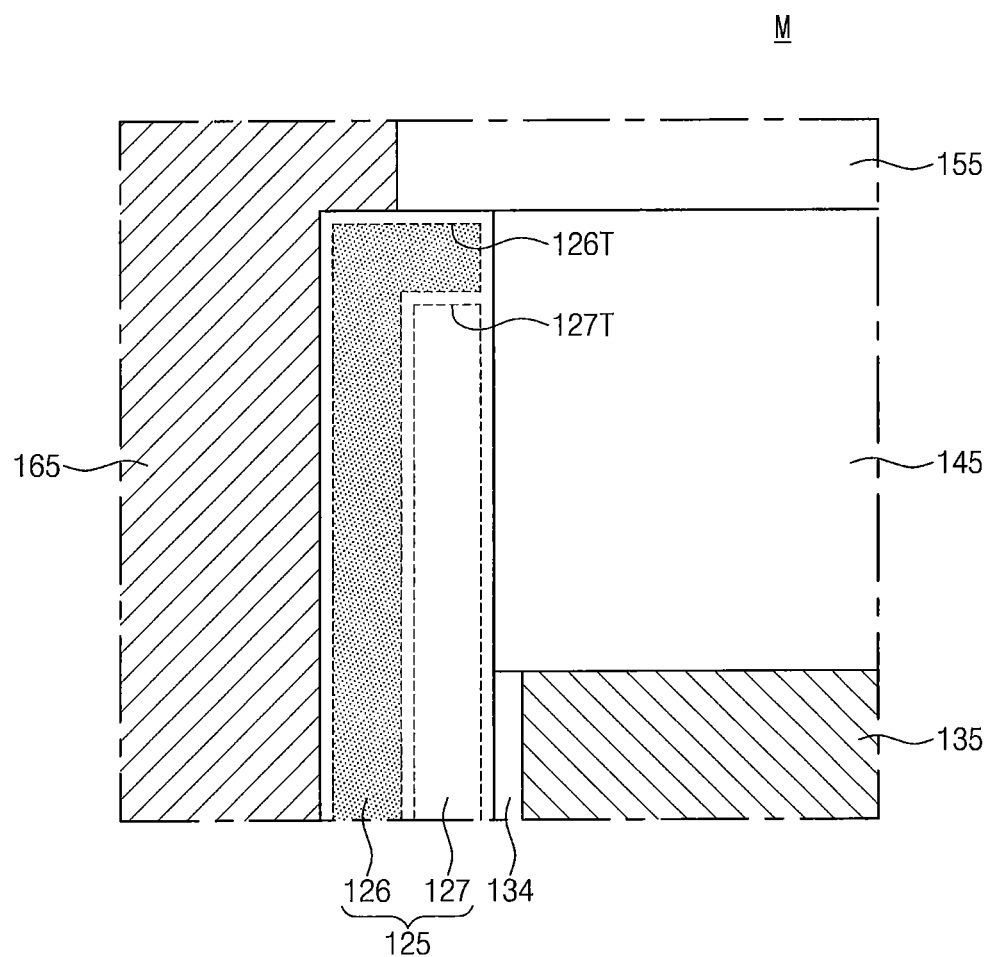
FIG. 2B is a sectional view illustrating a portion, corresponding to the region M of FIG. 2A, of a semiconductor device, according to other example embodiments of the inventive concept.

FIG. 2B is a sectional view illustrating a portion, corresponding to the region M of FIG. 2A, of a semiconductor device, according to other example embodiments of the inventive concept. In the following description, for concise description, an element previously described with reference to FIGS. 1 and 2A may be identified by a similar or identical reference number without repeating an overlapping description thereof.

Referring to FIG. 2B, each of the spacers 125 may include the first portion 127 and the second portion 126. Here, the second portion 126 may extend onto the first portion 127 and may serve as side and top regions of the spacer 125. For example, the top surface 126T of the second portion 126 may be higher than the top surface 127T of the first portion 127. Since the second portion 126 serves as the top region of the spacer 125 adjacent the gate capping layer 145, it is possible to effectively protect the gate electrode 135, when the contact 165 is formed.

FIGS. 3A through 3H are sectional views illustrating methods of fabricating a semiconductor device, according to example embodiments of the inventive concept. FIGS. 3A through 3H are sectional views corresponding to the line I-I' of FIG. 1.

Figure 3A:
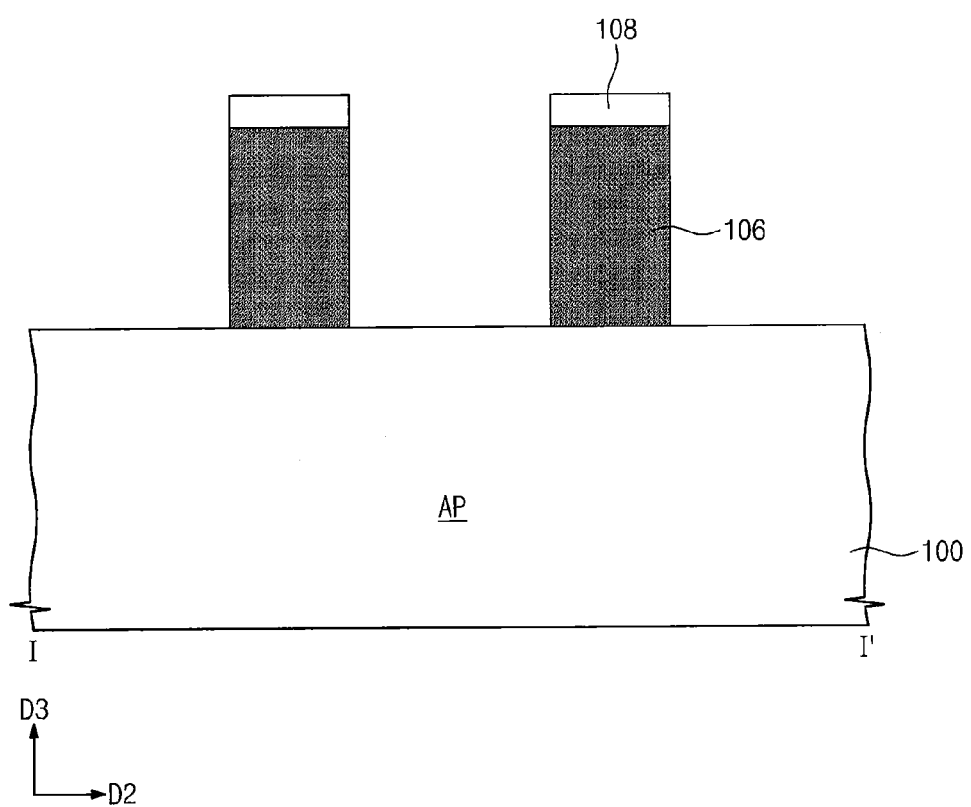
FIGS. 3A through 3H are sectional views illustrating methods of fabricating a semiconductor device, according to example embodiments of the inventive concept.

Referring to FIGS. 1 and 3A, sacrificial gate patterns 106 and gate mask patterns 108, which are sequentially stacked, may be formed on the substrate 100. The substrate 100 may be a semiconductor substrate (e.g., of silicon, germanium, and/or silicon-germanium) and/or a compound semiconductor substrate. The device isolation layer 104 may be formed on or in the substrate 100 to define the active pattern AP. The device isolation layer 104 may be formed using a shallow trench isolation (STI) method. For example, the formation of the device isolation layer 104 may include patterning the substrate 100 to form a trench (not shown) and filling the trench with an insulating layer (e.g., of silicon oxide).

The active pattern AP may correspond to a portion of the substrate 100 surrounded by the device isolation layer 104. The active pattern AP may be a line- or bar-shaped structure extending in a second direction D2 parallel to a top surface of the substrate 100. Although one active pattern AP is illustrated, the substrate 100 may have a plurality of the active patterns AP. In this case, the active patterns AP may be arranged along the first direction D1 crossing the second direction D2. The active pattern AP may be doped to have a first conductivity type.

Each of the sacrificial gate patterns 106 and the gate mask patterns 108 may be a line- or bar-shaped structure crossing the active pattern AP and extending parallel to the first direction D1. For example, the sacrificial gate patterns 106 and the gate mask patterns 108 may be formed by sequentially forming a sacrificial gate layer (not shown) and a gate mask layer (not shown) on the substrate 100 and patterning the sacrificial gate layer and the gate mask layer.

A plurality of the sacrificial gate patterns 106 may be formed to cross at least one of the active patterns AP. As an example, a pair of the sacrificial gate patterns 106 may be formed spaced apart from each other in the second direction D2 and may extend parallel to the first direction D1 on the active pattern AP. The sacrificial gate layer may be formed of or include a poly-silicon layer. The gate mask layer may be formed of or include a silicon nitride layer or a silicon oxynitride layer.

Although not shown, before the formation of the sacrificial gate layer, a pad oxide (not shown) may be formed on the substrate 100. The pad oxide may be formed by a dry oxidation process, a wet oxidation process, and/or a radical oxidation process. For the sake of simplicity, the description that follows will refer to an example of the present embodiment in which a pair of the sacrificial gate patterns 106 are spaced apart from each other in the second direction D2 and are formed to cross one of the active patterns AP.

Figure 3B:
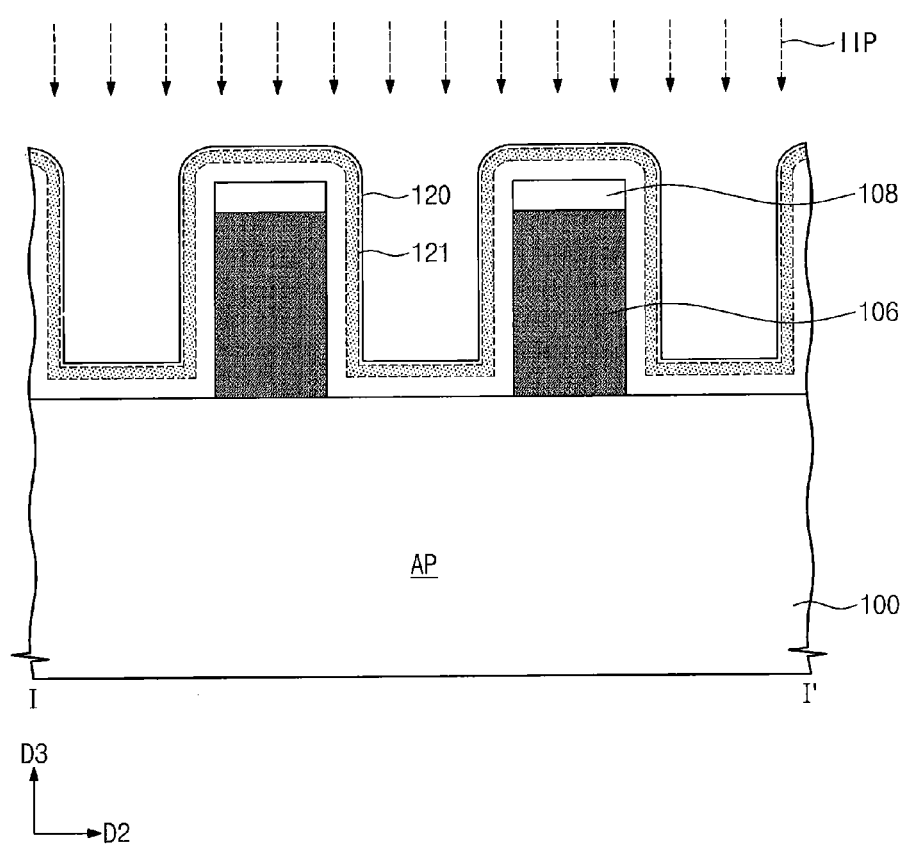

Referring to FIGS. 1 and 3B, a spacer layer 120 may be formed to cover the sacrificial gate patterns 106. For example, the spacer layer 120 may be conformally formed on the resulting structure provided with the sacrificial gate patterns 106. The spacer layer 120 may be formed of or include a nitride-based low-k insulating layer. As an example, the spacer layer 120 may be formed of or include at least one of SiON, SiCON, and/or SiN. In the case where the spacer layer 120 includes silicon nitride (SiN), the spacer layer 120 may be formed to have a porous structure and thereby to have a reduced dielectric constant.

The spacer layer 120 may be doped with silicon ions. For example, an ion implantation process IIP may be performed to inject silicon ions into the spacer layer 120, and thus, a doped region 121 may be formed in an upper region of the spacer layer 120. The ion implantation process IIP may be performed at a dose ranging from $1.0E14/cm^2$ to $1.0E16/cm^2$. Accordingly, the doped region 121 may have a silicon concentration ranging from 30 at % to 40 at %. In more detail, the doped region 121 may have a silicon concentration ranging from about 33 at % to about 35 at %. As shown in FIG. 3B, the doped region 121 may have a uniform thickness.

As an example, a portion of the doped region 121, which is positioned adjacent the sidewalls of the sacrificial gate patterns 106, may have a thickness ranging from 2 nm to 20 nm. As another example, the doped region 121 may have a non-uniform thickness. For example, a thickness of a portion of the doped region 121, which is positioned adjacent the gate mask patterns 108, may be greater than that of the portion of the doped region 121, which is positioned adjacent the sidewalls of the sacrificial gate patterns 106. A thickness profile of the doped region 121 may be changed by controlling the ion implantation process IIP, but example embodiments of the inventive concept are not limited thereto.

Figure 3C:
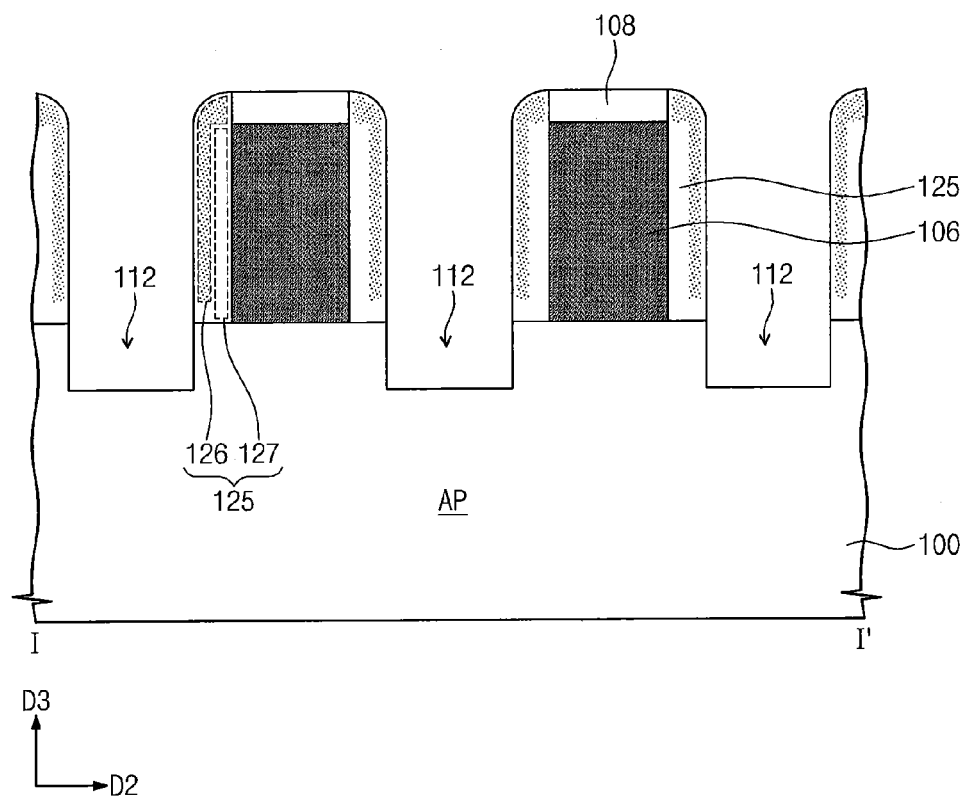

Referring to FIGS. 1 and 3C, the spacer layer 120 may be anisotropically etched to form the spacers 125 covering the sidewalls of the sacrificial gate patterns 106. For example, the spacers 125 may be formed by performing an anisotropic etching process on the spacer layer 120. Each of the spacers 125 may include the first portion 127, which is disposed adjacent the sacrificial gate pattern 106, and the second portion 126, which are spaced apart from the sacrificial gate pattern 106 with the first portion 127 interposed therebetween. Here, the second portion 126 may be a portion of the doped region 121, which remain after the anisotropic etching process. A bottom surface of the second portion 126 may be positioned at a higher level than a bottom surface of the first portion 127.

Next, recess regions 112 may be formed in the active pattern AP. The recess regions 112 may be formed by selectively etching the active pattern AP using the gate mask patterns 108 and the spacers 125 as an etch mask. As a result, the recess regions 112 may be formed between a pair of the sacrificial gate patterns 106 and in the active pattern AP positioned at both sides of the sacrificial gate patterns 106. Although not shown, the bottom surfaces of the recess regions 112 may be positioned at a higher level than the bottom surface of the device isolation layer 104. As an example, the etching process for forming the recess regions 112 may include an anisotropic etching process. As another example, the etching process for forming the recess regions 112 may include an isotropic etching process (e.g., a wet etching process). In this case, unlike that illustrated in FIG. 3C, the recess regions 112 may extend below the sacrificial gate patterns 106.

Figure 3D:
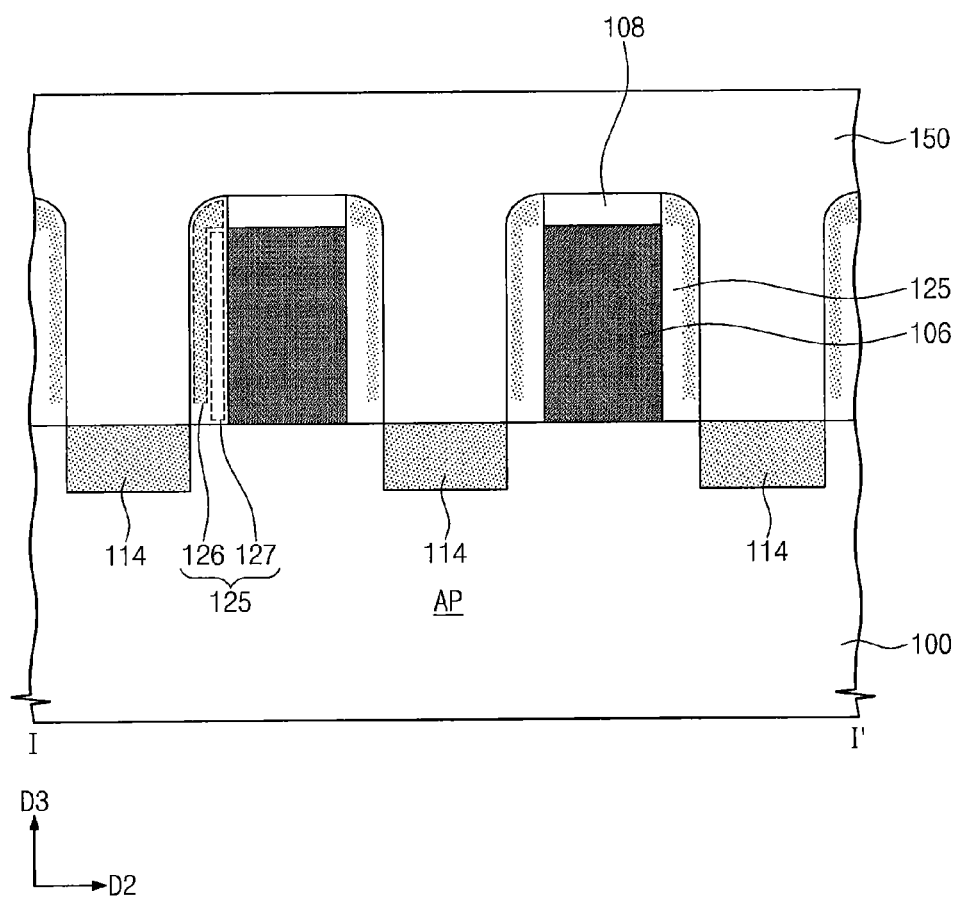

Referring to FIGS. 1 and 3D, the source/drain regions 114 may be formed in the recess regions 112, respectively. The source/drain regions 114 may serve as source/drain electrodes of a field effect transistor according to example embodiments of the inventive concept.

For example, the source/drain regions 114 may be formed by a selective epitaxial growth process using the substrate 100 as a seed layer. As an example, the selective epitaxial growth process may include a chemical vapor deposition (CVD) process and/or a molecular beam epitaxy (MBE) process. Each of the source/drain regions 114 may be formed to wholly fill a corresponding one of the recess regions 112. Although the source/drain regions 114 are illustrated to have the top surfaces coplanar with that of the active pattern AP, the top surfaces of the source/drain regions 114 may be positioned at a higher level than that of the active pattern AP. In addition, although not illustrated, the source/drain regions 114 may have a curved top surface with non-vanishing curvature. As an example, the source/drain regions 114 may upward convex top surfaces.

The source/drain regions 114 may include a semiconductor element different from those of the substrate 100. For example, the source/drain regions 114 may be formed of or include a semiconductor material having a lattice constant different from (for example, greater or smaller than) the substrate 100. This may make it possible to exert a compressive stress or a tensile stress to a channel region defined in the active pattern AP and below the sacrificial gate patterns 106. In the case where the substrate 100 is a silicon wafer, the source/drain regions 114 may be formed of or include a silicon-germanium (e.g., e-SiGe) and/or germanium layer. In this case, the source/drain regions 114 may exert a compressive stress on the channel regions (preferably, of PMOS field effect transistors). In the case where the substrate 100 is a silicon wafer, the source/drain regions 114 may be formed of or include a silicon carbide (SiC) layer. In this case, the source/drain regions 114 may exert a tensile stress on the channel regions (preferably, of NMOS field effect transistors). The compressive or tensile stress to be exerted on the channel region by the source/drain regions 114 may make it possible for carriers in the channel regions to have an increased mobility, when the field effect transistors are operated.

The source/drain regions 114 may be doped to have the second conductivity type different from the conductivity type of the active pattern AP. In some embodiments, the source/drain regions 114 may be formed using an in-situ doping process. In some embodiments, an ion implantation process may be performed to realize the second conductivity type of the source/drain regions 114, after the formation of the source/drain regions 114.

The first interlayer insulating layer 150 may be formed on the resulting structure provided with the source/drain regions 114. The first interlayer insulating layer 150 may be formed of an oxide-based insulating layer and may be formed to cover the sacrificial gate patterns 106 and the gate mask patterns 108. As an example, the first interlayer insulating layer 150 may include a silicon oxide layer and may be formed by a flowable chemical vapor deposition (FCVD) process.

Figure 3E:
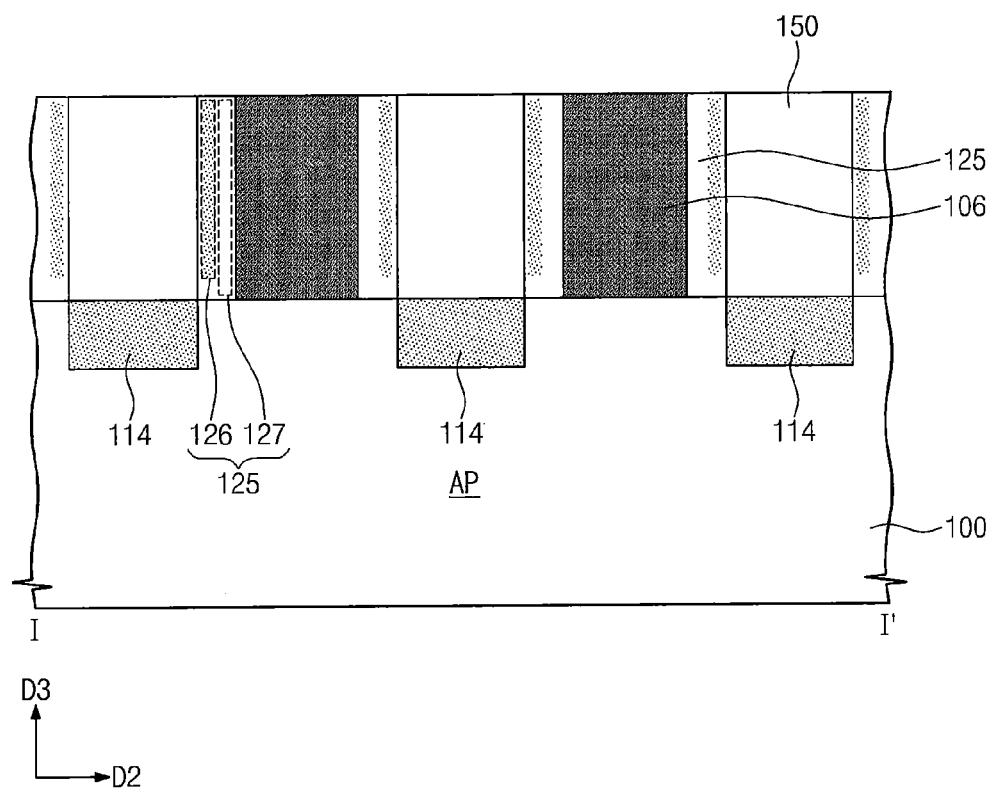

Referring to FIGS. 1 and 3E, the first interlayer insulating layer 150 may be planarized to expose the top surfaces of the sacrificial gate patterns 106. The planarization of the first interlayer insulating layer 150 may be performed using an etch-back process or a chemical-mechanical polishing (CMP) process. The planarization of the first interlayer insulating layer 150 may be performed to remove the gate mask patterns 108 and thereby to expose the top surfaces of the sacrificial gate patterns 106. The planarization of the first interlayer insulating layer 150 may be performed to remove top portions of the spacers 125. As a result, the top surface of the first interlayer insulating layer 150 may be coplanar with top surfaces of the sacrificial gate patterns 106 and the spacers 125.

Figure 3F:
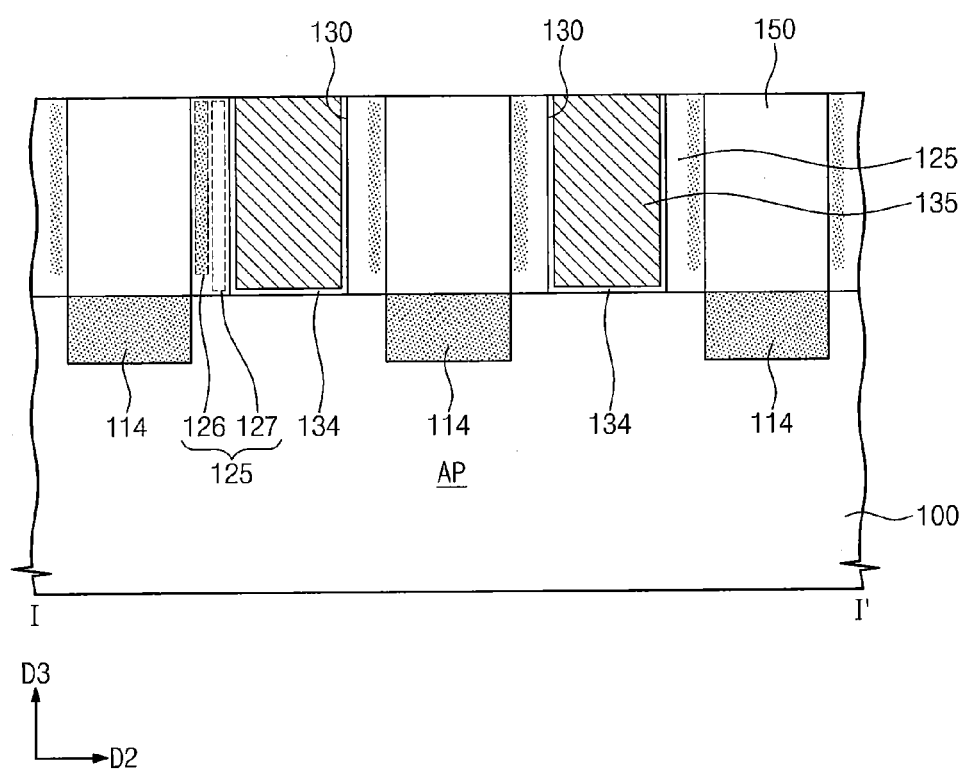

Referring to FIGS. 1 and 3F, the sacrificial gate patterns 106 may be removed to form gate trenches 130. The gate trenches 130 may be formed by an etching process of selectively removing the sacrificial gate patterns 106. The gate trenches 130 may be formed to expose the top surface of the substrate 100 and extend in the first direction D1.

The gate dielectric layer 134 and the gate electrode 135 may be formed in each of the gate trenches 130. The gate dielectric layer 134 may be formed on the resulting structure provided with the gate trenches 130. The gate dielectric layer 134 may be conformally formed to have a thickness that is too small to completely fill the gate trenches 130. For example, the gate dielectric layer 134 may be formed to cover bottom surfaces of the gate trenches 130 and cover sidewalls of the spacers 125, which are exposed by the gate trenches 130, and the top surface of the first interlayer insulating layer 150. The gate dielectric layer 134 may be formed by an atomic layer deposition (ALD) process and/or a chemical oxidation process. As an example, the gate dielectric layer 134 may be formed of or include a high-k dielectric material. For example, the gate dielectric layer 134 may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

Thereafter, a gate electrode layer may be formed on the gate dielectric layer 134 to fill the gate trenches 130, and the gate electrode layer and the gate dielectric layer 134 may be planarized to expose the top surface of the first interlayer insulating layer 150. As a result, the gate dielectric layer 134 and the gate electrode 135 may be locally formed in each of the gate trenches 130. The gate dielectric layer 134 and the gate electrode 135 may extend in the first direction D1. In some embodiments, the gate electrode layer may be formed of or include at least one of conductive metal nitrides (e.g., titanium nitride and/or tantalum nitride) and/or metals (e.g., titanium, tantalum, tungsten, copper, and/or aluminum). The gate electrode layer may be formed by a deposition process (e.g., a CVD or sputtering process). The planarization of the gate electrode layer and the gate dielectric layer 134 may include a CMP process. As a result of the planarization process, the first interlayer insulating layer 150 may have the top surface coplanar with the top surfaces of the gate electrodes 135 and the spacers 125.

Figure 3G:
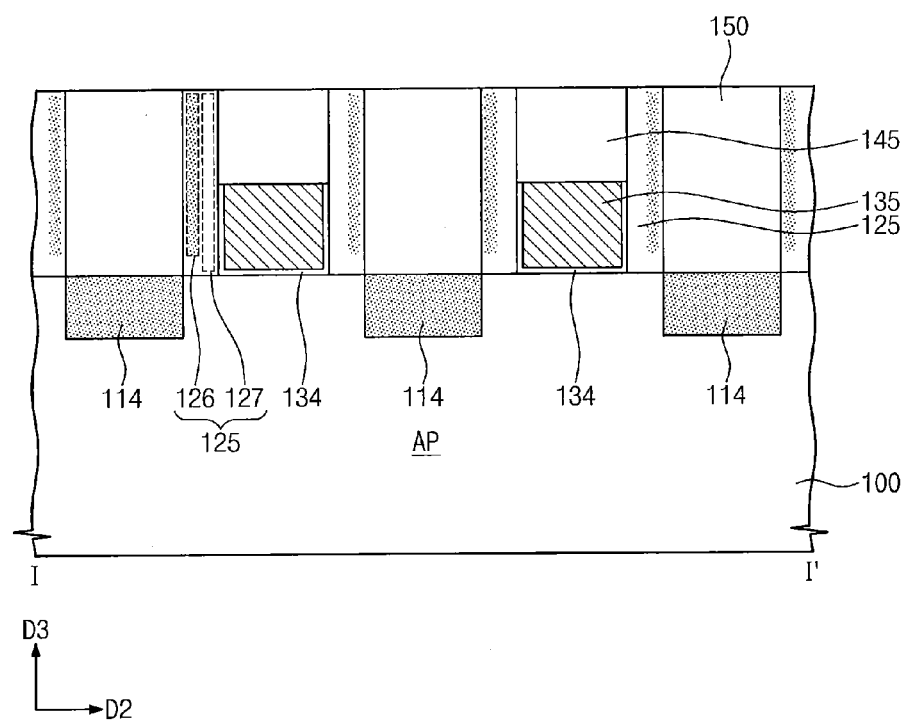

Referring to FIGS. 1 and 3G, upper portions of the gate electrodes 135 may be recessed, and the gate capping layers 145 may be formed on the gate electrodes 135, respectively.

In detail, a selective etching process may be performed to remove the upper portions of the gate electrodes 135. As a result of the etching process, the top surfaces of the gate electrodes 135 may be lower than the top surface of the first interlayer insulating layer 150. In some embodiments, portions of the gate dielectric layer 134 positioned above the gate electrodes 135 may be removed, after the recessing of the upper portions of the gate electrodes 135. As a result, the gate dielectric layer 134 may be provided between the gate electrode 135 and the substrate 100 and between the gate electrode 135 and the spacers 125.

Thereafter, the gate capping layers 145 may be formed to cover the recessed top surfaces of the gate electrodes 135, respectively. The gate capping layers 145 may be formed to fill the empty regions, which are formed by recessing the upper portions of the gate electrodes 135. The gate capping layers 145 may be formed of a material having an etch selectivity with respect to the first and second interlayer insulating layers 150 and 155. As an example, the gate capping layers 145 may be formed of or include at least one of SiON, SiCN, SiCON, and/or SiN. The gate capping layers 145 may be formed by an atomic layer deposition (ALD) process, a plasma-enhanced chemical vapor deposition (PECVD) process, and/or a high-density plasma chemical vapor deposition (HDPCVD) process.

Figure 3H:
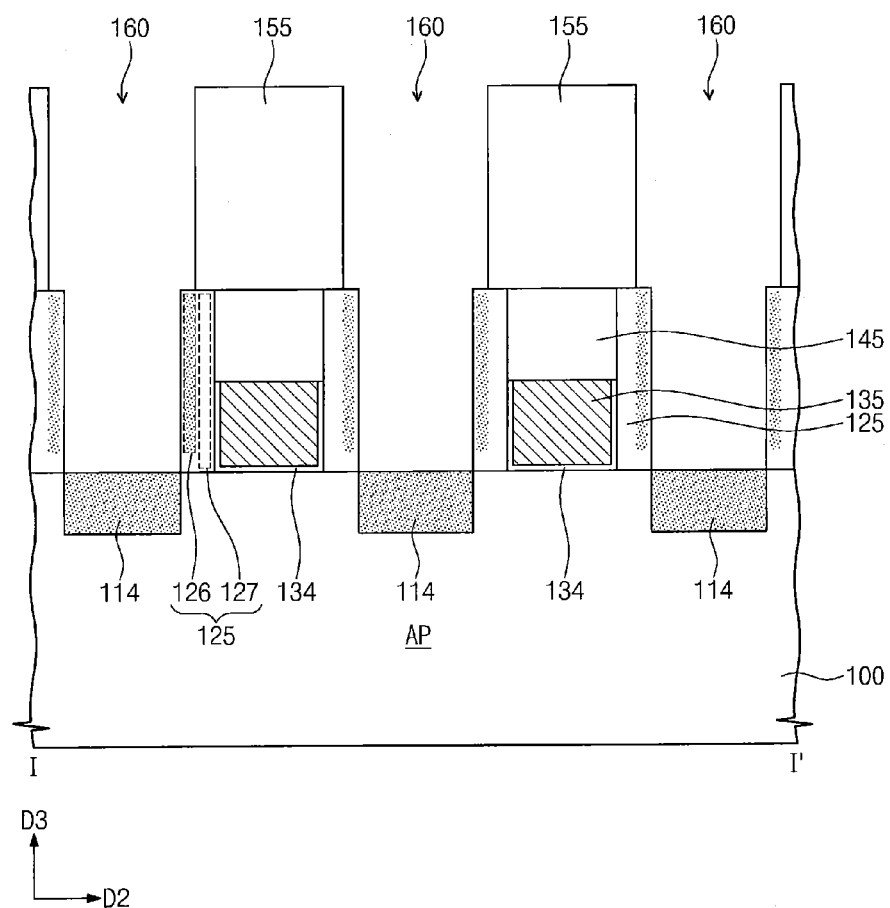

Referring to FIGS. 1 and 3H, the second interlayer insulating layer 155 may be formed. The second interlayer insulating layer 155 may be formed of or include a silicon oxide layer or a low-k oxide layer. The low-k oxide layer may include, for example, a carbon-doped silicon oxide layer (e.g., SiCOH). The second interlayer insulating layer 155 may be formed by a CVD process.

Next, contact holes 160 may be formed to penetrate the second interlayer insulating layer 155 and the first interlayer insulating layer 150 and to expose the top surfaces of the source/drain regions 114. At least one of the contact holes 160 may expose the sidewall of the spacer 125 (e.g., the second portion 126). The contact holes 160 may be formed in a self-aligned manner by the spacers 125. For example, the formation of the contact holes 160 may include forming a photoresist pattern (not shown) on the second interlayer insulating layer 155 to define positions and dispositions of the contact holes 160 and performing an anisotropic etching process using the photoresist pattern as an etch mask. The photoresist pattern (not shown) may be formed to have openings (not shown), whose planar shapes are substantially equal or similar to those of the contact holes 160.

The gate capping layers 145 and the second portions 126 of the spacers 125 may have a high etch selectivity with respect to the first and second interlayer insulating layers 150 and 155. In particular, since, as described above, the second portions 126 are additionally doped with silicon ions through the ion implantation process IIP, the second portions 126 may have a relatively higher etch resistant property, compared with that of the first portions 127. Accordingly, it is possible to prevent the spacers 125 exposed by the contact holes 160 from being etched in the etching process for forming the contact holes 160. In other words, by providing the second portions 126 according to example embodiments of the inventive concept, it is possible to increase a process margin in the etching process for forming the contact holes 160 and to effectively protect the sidewalls of the gate electrodes 135. In other words, it is possible to form the contacts 165 in a self-aligned and effective manner.

The metal silicide layers 116 may be formed on the source/drain regions 114 exposed by the contact holes 160. The formation of the metal silicide layers 116 may include forming a metal layer on the source/drain regions 114 and performing a thermal treatment process on the metal layer to form a metal-silicide layer. The metal silicide layers 116 may include at least one of, for example, titanium silicide, tantalum silicide, and/or tungsten silicide.

Referring back to FIGS. 1 and 2A, the contacts 165 may be formed to be in contact with the metal silicide layers 116 in the contact holes 160. At least one of the contacts 165 may be in partial contact with the second portion 126. In other words, the contacts 165 may be self-aligned contacts that are formed in a self-aligned manner by the spacers 125. For example, the formation of the contacts 165 may include forming a conductive layer on the resulting structure provided with the contact holes 160 to fill the contact holes 160 and performing a planarization process to expose the top surface of the second interlayer insulating layer 155. Here, the conductive layer may be formed of or include a metallic material (e.g., tungsten). In some embodiments, the formation of the conductive layer may include sequentially depositing a barrier metal layer (e.g., metal nitride) and a metal layer (e.g., tungsten).

Figure 4:
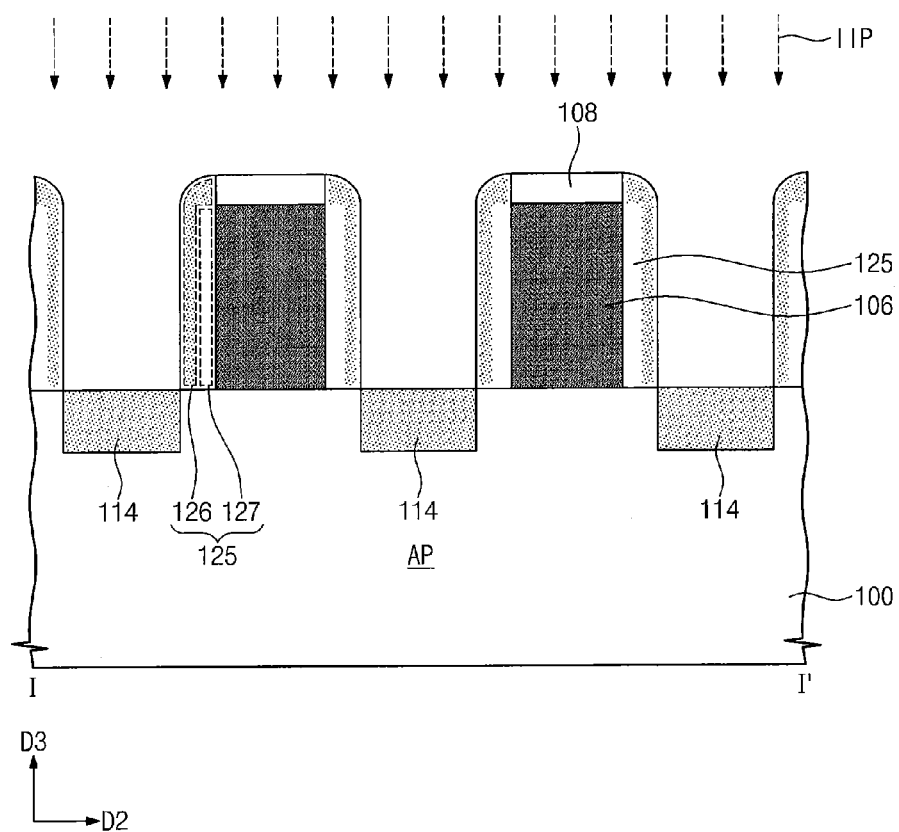
FIG. 4 is a sectional view illustrating methods of fabricating a semiconductor device, according to other example embodiments of the inventive concept.

FIG. 4 is a sectional view illustrating methods of fabricating a semiconductor device, according to some other example embodiments of the inventive concept. FIG. 4 is a sectional view corresponding to the line I-I' of FIG. 1. In the following description, for concise description, an element previously described with reference to FIG. 1 and FIGS. 3A through 3H may be identified by a similar or identical reference number without repeating an overlapping description thereof.

Unlike that previously described with reference to FIGS. 1 and 3B, the spacer layer 120 may be formed to cover the sacrificial gate patterns 106, but the ion implantation process IIP on the spacer layer 120 may be omitted.

Thereafter, as described with reference to FIGS. 1 and 3C, the spacer layer 120 may be anisotropically etched to form the spacers 125, and the recess regions 112 may be formed in the active pattern AP. Next, as described with reference to FIGS. 1 and 3D, the source/drain regions 114 may be formed in the recess regions 112, respectively.

However, as shown in FIGS. 1 and 4, before the formation of the first interlayer insulating layer 150, the ion implantation process IIP may be performed on the spacers 125. As a result, the second portions 126 doped with silicon ions may be formed in the spacers 125. The first portions 127 may be interposed between the second portions 126 and the sacrificial gate patterns 106. The second portions 126 may have a silicon concentration higher than that of the first portions 127; for example, the silicon concentration of the second portions 126 may ranging from 30 at % to 40 at %. In particular, the second portions 126 may have a silicon concentration ranging from about 33 at % to about 35 at %. The second portion 126 may have a bottom surface coplanar with that of the first portion 127. Except for these features, the ion implantation process IIP may be performed in the same manner as that previously described with reference to FIG. 3B.

Furthermore, aside from those described with reference to FIGS. 3B and 4, the ion implantation process IIP may be performed at any time between the formation of the spacer layer 120 and the formation of the first interlayer insulating layer 150, although not shown.

Figure 5:
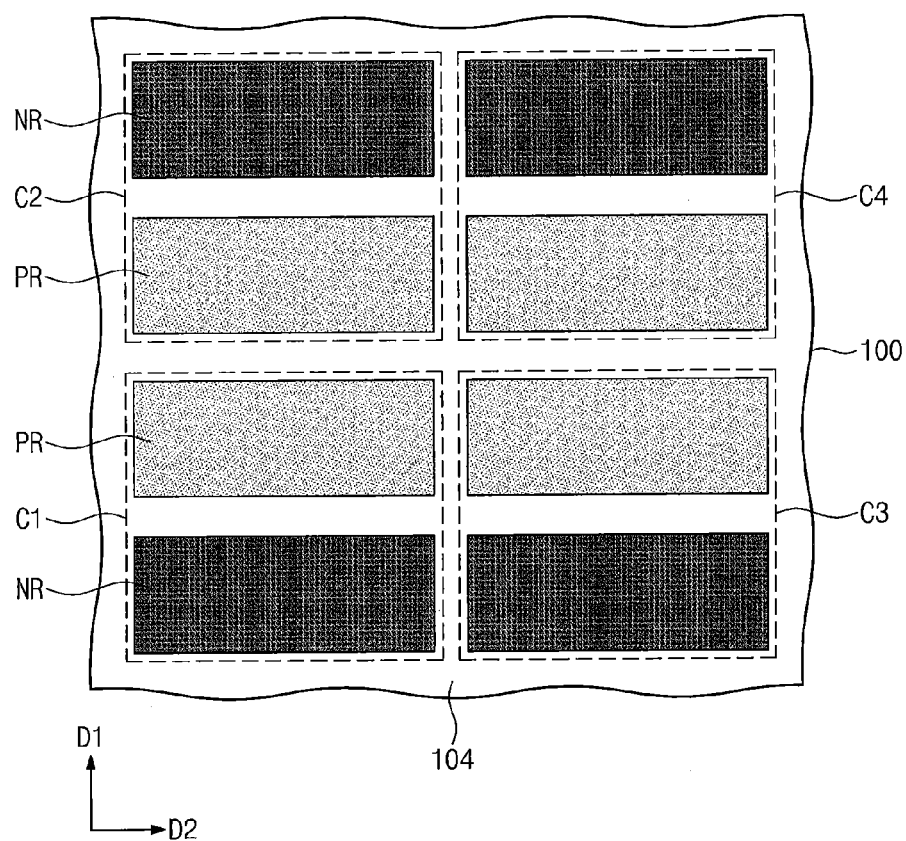
FIG. 5 is a plan view illustrating a semiconductor device, according to other example embodiments of the inventive concept.

FIG. 5 is a plan view illustrating a semiconductor device, according to other example embodiments of the inventive concept.

Referring to FIG. 5, a semiconductor device according to example embodiments of the inventive concept may include a plurality of logic cells C1, C2, C3, and C4 provided on a substrate. Each of the logic cells C1, C2, C3, and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 crossing the first direction D1, and a fourth logic cell C4 spaced apart from the second logic cell C2 in the second direction D2. Each of the logic cells C1, C2, C3, and C4 may include active regions spaced apart from each other by device isolation layers 104. Each of the logic cells C1, C2, C3, and C4 may include a PMOSFET region PR and an NMOSFET region NR which are spaced apart from each other by the device isolation layers 104.

As an example, the PMOSFET and NMOSFET regions PR and NR may be spaced apart from each other in the first direction D1. The PMOSFET region PR of the first logic cell C1 may be disposed adjacent the PMOSFET region PR of the second logic cell C2 in the first direction D1. In the following description, a term "logic cell" may refer to a unit circuit configured to perform a single logical operation. Further, the number of the logic cells may be variously changed from that illustrated in the drawing.

Figure 6:
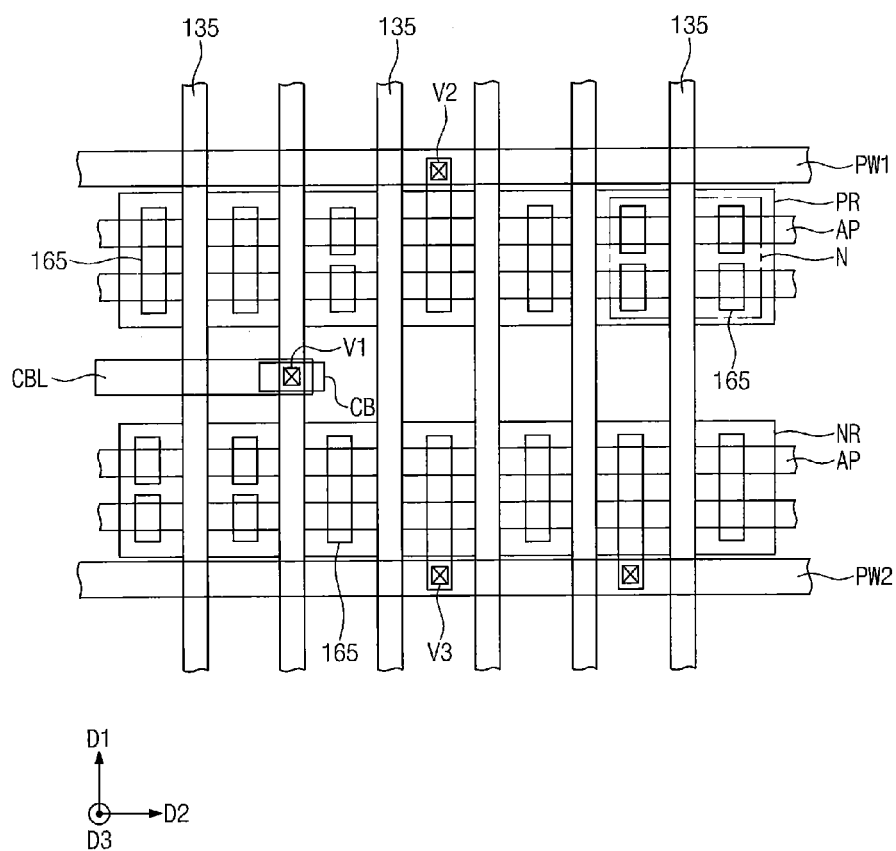
FIG. 6 is a plan view illustrating a portion of a semiconductor device, according to other example embodiments of the inventive concept.
Figure 7:
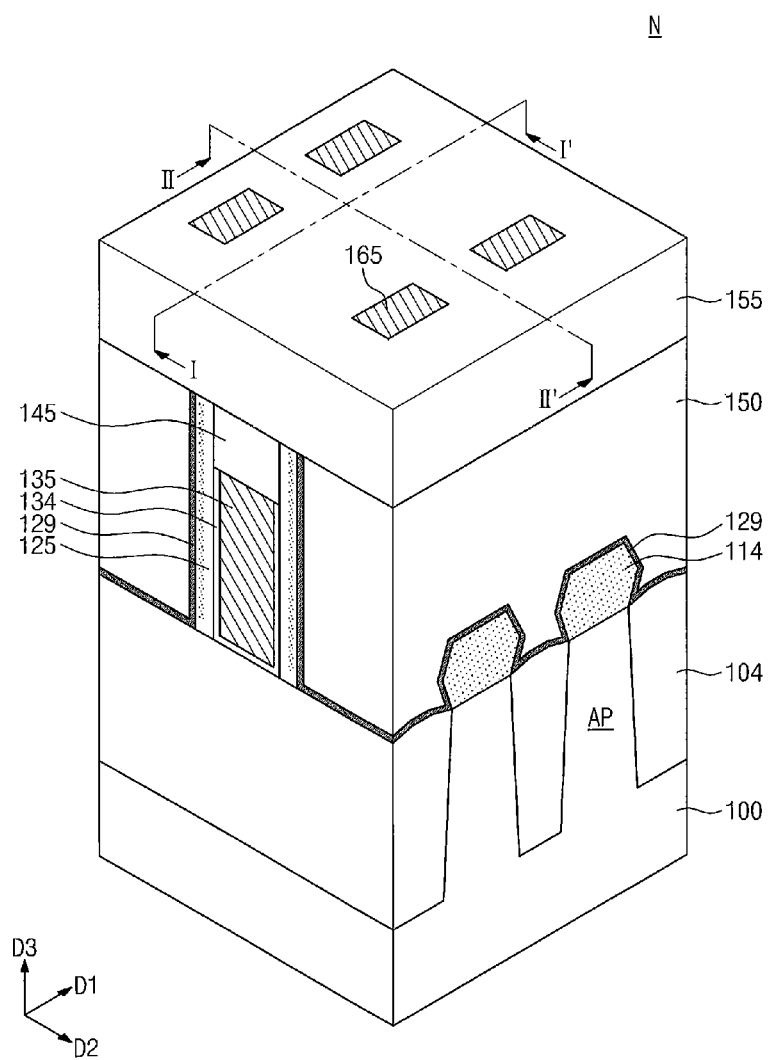
FIG. 7 is a perspective view illustrating the region N of FIG. 6.
Figure 8:
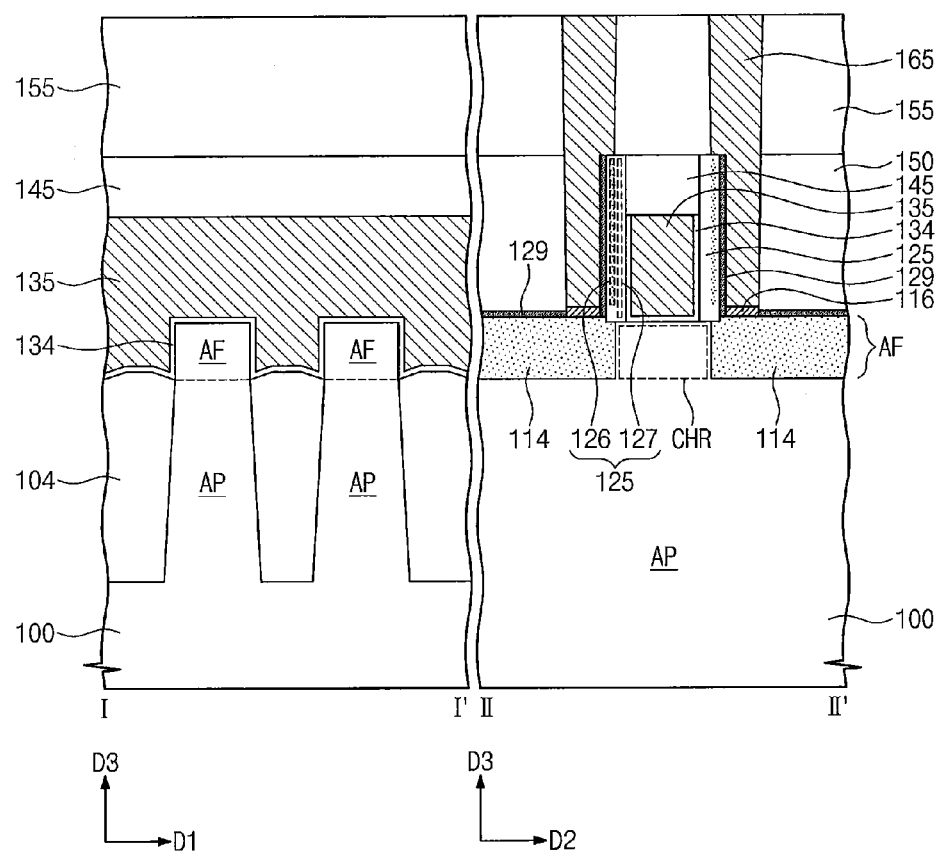
FIG. 8 is a sectional view taken along lines I-I' and II-II' of FIG. 7.

FIG. 6 is a plan view illustrating a portion of a semiconductor device, according to some other example embodiments of the inventive concept. For example, FIG. 6 is a plan view illustrating the first logic cell C1 of FIG. 5. Hereinafter, various embodiments of the inventive concept will be described with reference to the first logic cell C1 of FIG. 5, but the others of the logic cells may have substantially the same or similar structure as that of the first logic cell C1. FIG. 7 is a perspective view illustrating the region N of FIG. 6. FIG. 8 is a sectional view taken along lines I-I' and II-II' of FIG. 7. In the following description, for concise description, an element previously described with reference to FIGS. 1 and 2A may be identified by a similar or identical reference number without repeating an overlapping description thereof.

Referring to FIGS. 6, 7, and 8, the device isolation layers 104 may be provided in the substrate 100 to define the PMOSFET and NMOSFET regions PR and NR. The device isolation layers 104 may be formed in a top portion of the substrate 100. In example embodiments, the device isolation layers 104 may include an insulating material, such as silicon oxide.

The PMOSFET and NMOSFET regions PR and NR may be spaced apart from each other, in the first direction D1 parallel to a top surface of the substrate 100, by the device isolation layers 104 interposed therebetween. Although each of the PMOSFET and NMOSFET regions PR and NR is illustrated to be a single region, it may include a plurality of regions spaced apart from each other by the device isolation layers 104.

A plurality of active patterns AP may be provided on the PMOSFET and NMOSFET regions PR and NR to extend in the second direction D2 crossing the first direction D1. The active patterns AP may be arranged along the first direction D1. The device isolation layers 104 may be provided at both sides of each of the active patterns AP to define the active patterns AP. Although the number of the active patterns AP provided on each of the PMOSFET and NMOSFET regions PR and NR is shown to be two, example embodiments of the inventive concept may not be limited thereto.

Each of the active patterns AP may include active fins AF protruding between the device isolation layers 104. For example, each of the active fins AF may have a structure protruding from the active pattern AP in a third direction D3 perpendicular to the top surface of the substrate 100. Each of the active fins AF may include the source/drain regions 114 and a channel region CHR interposed between the source/drain regions 114.

In some embodiments, the gate electrodes 135 may be provided on the substrate 100 to cross the active patterns AP. The source/drain regions 114 may be provided at both sides of each of the gate electrodes 135. In addition, the contacts 165 may be provided at both sides of each of the gate electrodes 135 and may be electrically connected to the source/drain regions 114. Each of the contacts 165 may be connected to a corresponding one or some of the source/drain region 114, but example embodiments of the inventive concept may not be limited thereto.

A gate contact CB and a conductive line CBL may be provided on one of the gate electrodes 135. A first via V1 may be disposed between the gate contact CB and the conductive line CBL. The conductive line CBL may be electrically connected to the one of the gate electrodes 135 through the first via V1 and the gate contact CB to serve as a current path for applying signals to the one of the gate electrodes 135.

The first logic cell C1 may include a first wire PW1 provided near an outer edge of the PMOSFET region PR and a second wire PW2 provided near an outer edge of the NMOSFET region NR. As an example, the first wire PW1 on the PMOSFET region PR may serve as a current path for transmitting a drain voltage Vdd (e.g., a power voltage). The second wire PW2 on the NMOSFET region NR may serve as a current path for transmitting a source voltage Vss (e.g., a ground voltage).

The first and second wires PW1 and PW2 may extend in the second direction D2 and may be shared by a plurality of logic cells, which are disposed adjacent one another in the second direction D2. As an example, the first wire PW1 may be shared by the first logic cell C1 and the third logic cell C3. Furthermore, the first wire PW1 may be shared by the PMOSFET regions PR of the first and second logic cells C1 and C2.

In some embodiments, a second via V2 may be provided on one of the contact 165. Accordingly, the source/drain region 114 connected to the one of the contacts 165 may be electrically connected to the first wire PW1 through the one of the contacts 165 and the second via V2. Similarly, the source/drain region 114 on the NMOSFET region NR may also be electrically connected to the second wire PW2 through the one of the contacts 165 and a third via V3.

Hereinafter, the region N of the PMOSFET region PR shown in FIG. 6 will be described as an example, for the sake of simplicity.

The gate electrode 135 may be provided on the substrate 100 to cross the active patterns AP. The gate electrode 135 may be overlapped with the channel regions CHR of the active fins AF, when viewed in a plan view. In other words, the gate electrode 135 may be a line-shaped structure crossing the active fins AF and extending in the first direction D1.

The source/drain regions 114 may be provided on the active fins AF and at both sides of the gate electrode 135. The source/drain regions 114 may be epitaxial patterns, which are epitaxially grown from the active patterns AP. In some embodiments, when viewed in a vertical section, top surfaces of the channel regions CHR may be positioned at a higher level than bottom surfaces of the source/drain regions 114. The top surfaces of the source/drain regions 114 may be positioned at the same level as, or a higher level than, the top surfaces of the channel regions CHR.

The metal silicide layers 116 may be respectively interposed between the source/drain regions 114 and the contacts 165. In other words, the contacts 165 may be electrically connected to the source/drain regions 114 via the metal silicide layers 116.

The spacers 125 may be provided on both sidewalls of the gate electrode 135. The spacers 125 may extend along the gate electrode 135 or parallel to the first direction D1. Each of the spacers 125 may include the first portion 127 adjacent the gate electrode 135 and the second portion 126 adjacent the contact 165. The first and second portions 126 and 127 may be configured to have substantially the same features as those described with reference to FIGS. 2A and 2B.

The gate dielectric layer 134 may be provided between the gate electrode 135 and the active fins AF and between the gate electrode 135 and the spacers 125. The gate dielectric layer 134 may extend along the bottom surface of the gate electrode 135. For example, the gate dielectric layer 134 may cover top and side surfaces of the channel regions CHR. The gate dielectric layer 134 may extend horizontally from the active fins AF to partially cover a top surface of the device isolation layer 104. In some embodiments, the gate dielectric layer 134 may be provided to expose at least a portion of the top surface of the device isolation layer 104. The exposed portion of the device isolation layer 104, which is not covered with the gate dielectric layer 134, may be covered by the first interlayer insulating layer 150.

The gate capping layer 145 may be provided on the gate electrode 135. The gate capping layer 145 may extend along the gate electrode 135 or parallel to the first direction D1. The gate capping layer 145 may be formed to have substantially the same features as that described with reference to FIGS. 1 and 2A.

A first interlayer insulating layer 150 may be provided on the substrate 100. The first interlayer insulating layer 150 may cover the spacers 125 and the source/drain regions 114. The first interlayer insulating layer 150 may have a top surface that is substantially coplanar with that of the gate capping layer 145. The second interlayer insulating layer 155 may be formed on the first interlayer insulating layer 150 to cover the gate capping layer 145.

The contacts 165 may be provided on the substrate 100 to penetrate the second interlayer insulating layer 155 and the first interlayer insulating layer 150 and to be in contact with the metal silicide layers 116. In some embodiments, an etch stop layer 129 may be interposed between the contacts 165 and the spacers 125. Accordingly, at least one of the contacts 165 may be in direct contact with the etch stop layer 129. In addition, at least one of the contacts 165 may be in direct contact with the top surface of the second portion 126. In certain embodiments, the etch stop layer 129 may be omitted, and in this case, at least one of the contacts 165 may be in direct contact with the second portion 126 of the spacer 125. Due to the gate capping layer 145 and the spacers 125, the contacts 165 may be spaced apart from the gate electrode 135. Interconnection lines 190 may be provided on the second interlayer insulating layer 155 to be connected to the contacts 165.

FIGS. 9A through 9D are sectional views illustrating methods of fabricating a semiconductor device, according to some other example embodiments of the inventive concept. FIGS. 9A through 9D are sectional views taken along lines I-I' and II-II' of FIG. 7. In the following description, for concise description, an element or operation previously described with reference to FIGS. 3A through 3H may be identified by a similar or identical reference number without repeating an overlapping description thereof.

Figure 9A:
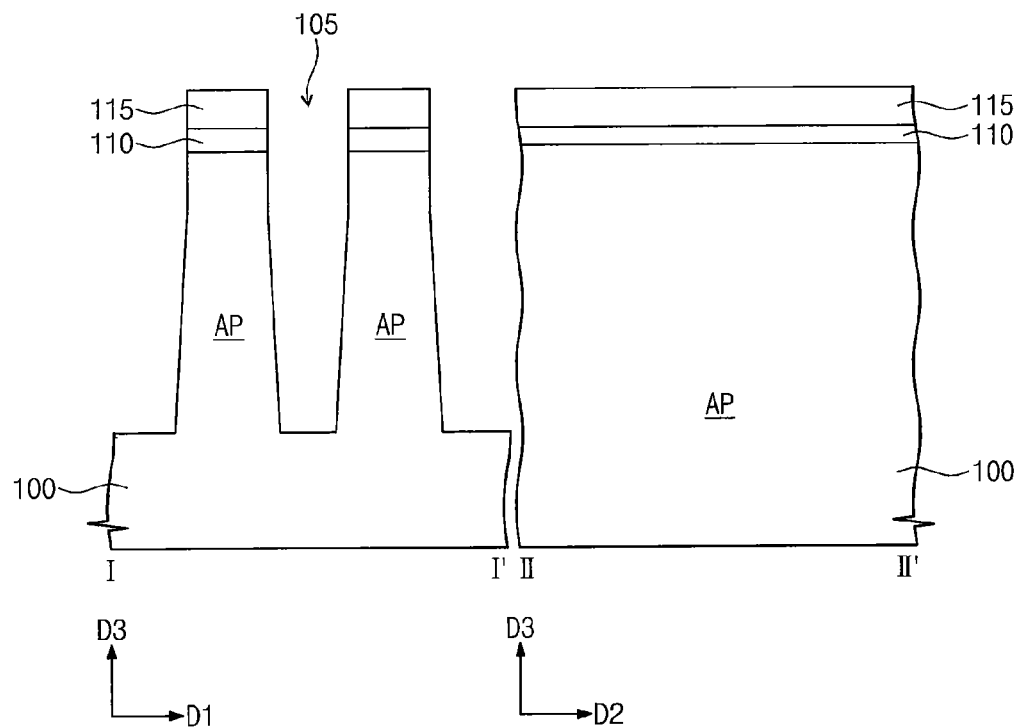
FIGS. 9A through 9D are sectional views illustrating methods of fabricating a semiconductor device, according to other example embodiments of the inventive concept.

Referring to FIG. 9A, the substrate 100 may be patterned to form device isolation trenches 105 defining the active patterns AP. The substrate 100 may be a semiconductor substrate (e.g., of silicon, germanium, or silicon-germanium) or a compound semiconductor substrate.

The formation of the device isolation trenches 105 may include forming mask patterns on the substrate 100 and anisotropically etching the substrate 100 using the mask patterns an etch mask. Each of the mask patterns may include a first mask pattern 110 and a second mask pattern 115, which are sequentially stacked on the substrate 100 and are formed to have an etch selectivity with respect to each other. Each of the device isolation trenches 105 may be formed to have an aspect ratio of at least 5. In some embodiments, each of the device isolation trenches 105 may be formed to have a downward tapered shape. Accordingly, each of the active patterns AP may be formed to have an upward tapered shape.

Figure 9B:
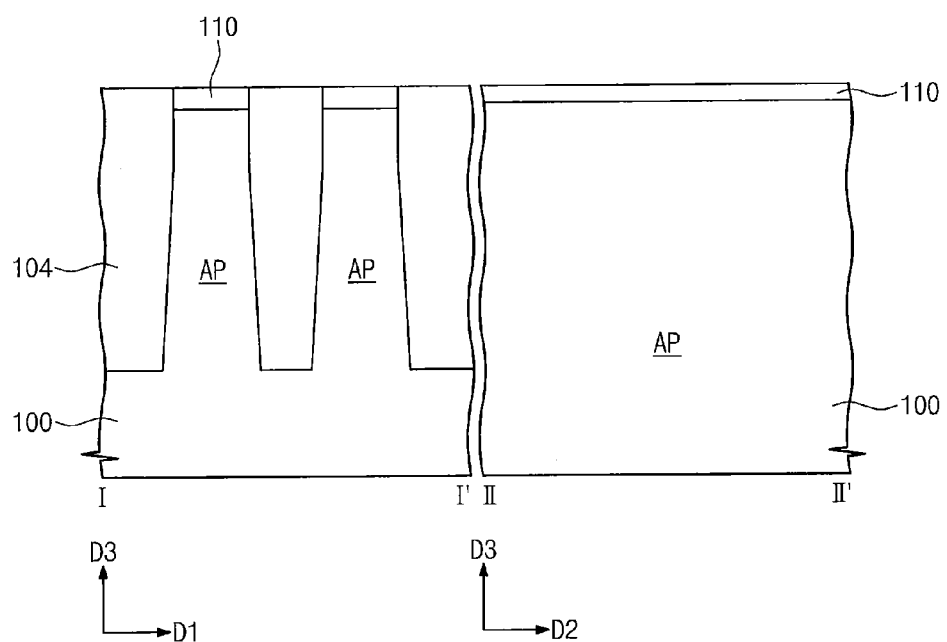

Referring to FIG. 9B, the device isolation layer 104 may be formed to fill the device isolation trenches 105. The formation of the device isolation layer 104 may include forming an insulating layer to fill the device isolation trenches 105 and planarizing the insulating layer to expose the top surface of the first mask pattern 110. As a result of the planarization process, the device isolation layer 104 may be locally formed in the device isolation trenches 105.

Figure 9C:
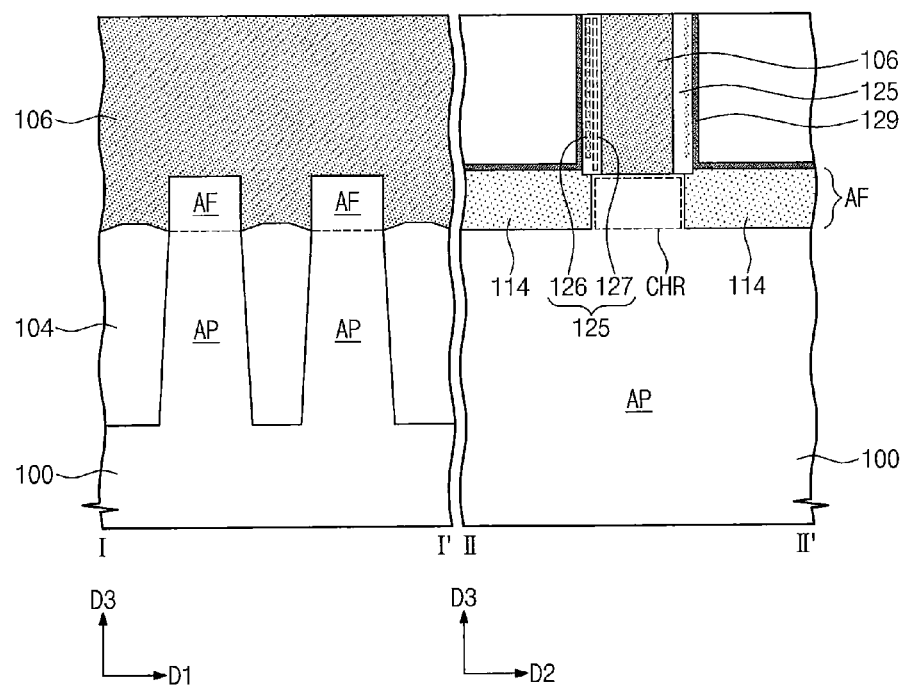

Referring to FIG. 9C, top portions (hereinafter, active fins AF) of the active patterns AP may be exposed. The exposing of the active fins AF may include recessing top portions of the device isolation layer 104 using, for example, a wet etching process. The recessing of the device isolation layer 104 may be performed using an etch recipe having an etch selectivity with respect to the active patterns AP. The recessing of the device isolation layer 104 may be performed to remove the first mask pattern 110 and thereby to expose top surfaces of the active fins AF.

A sacrificial gate pattern 106 and a gate mask pattern (not shown), which are sequentially stacked, may be formed on the active fins AF. The sacrificial gate pattern 106 and the gate mask pattern (not shown) may be formed by sequentially forming a sacrificial gate layer (not shown) and a gate mask layer (not shown) on the active fins AF and the device isolation layer 104 and patterning the sacrificial gate layer and the gate mask layer (e.g., see FIG. 3A). The sacrificial gate pattern 106 may be formed to cross the active fins AF.

The spacers 125 may be formed on both sidewalls of the sacrificial gate pattern 106. The formation of the spacers 125 may include conformally forming a spacer layer on the resulting structure provided with the sacrificial gate pattern 106 and performing an anisotropic etching process on the spacer layer. Here, an ion implantation process may be performed to inject silicon ions into the spacer layer or the spacers 125 (e.g., see FIGS. 3B and 4). As a result of the ion implantation process, each of the spacers 125 may include the first portion 127, which is disposed adjacent the sacrificial gate pattern 106, and the second portion 126, which are spaced apart from the sacrificial gate pattern 106 with the first portion 127 interposed therebetween. The second portion 126 may have a silicon concentration higher than that of the first portion 127.

The source/drain regions 114 may be formed at both sides of the sacrificial gate pattern 106 (e.g., see FIGS. 3C and 3D). The source/drain regions 114 may serve as source/drain electrodes of a field effect transistor according to example embodiments of the inventive concept. The active fins AF may include the channel regions CHR positioned below the sacrificial gate pattern 106. Each of the channel regions CHR may be interposed between the source/drain regions 114.

The etch stop layer 129 may be formed on the resulting structure provided with the source/drain regions 114. The etch stop layer 129 may cover the sacrificial gate patterns 106. The etch stop layer 129 may protect the source/drain regions 114 against etch damage caused by a subsequent etching process. For example, the etch stop layer 129 may be formed of or include silicon nitride (SiN). In some embodiments, the silicon ion implantation process may be performed on the spacers 125, after the formation of the etch stop layer 129.

Thereafter, the first interlayer insulating layer 150 may be formed. The formation of the first interlayer insulating layer 150 may include forming an insulating layer to cover the sacrificial gate patterns 106 and planarizing the insulating layer to expose the top surfaces of the sacrificial gate patterns 106 (e.g., see FIG. 3E).

Figure 9D:
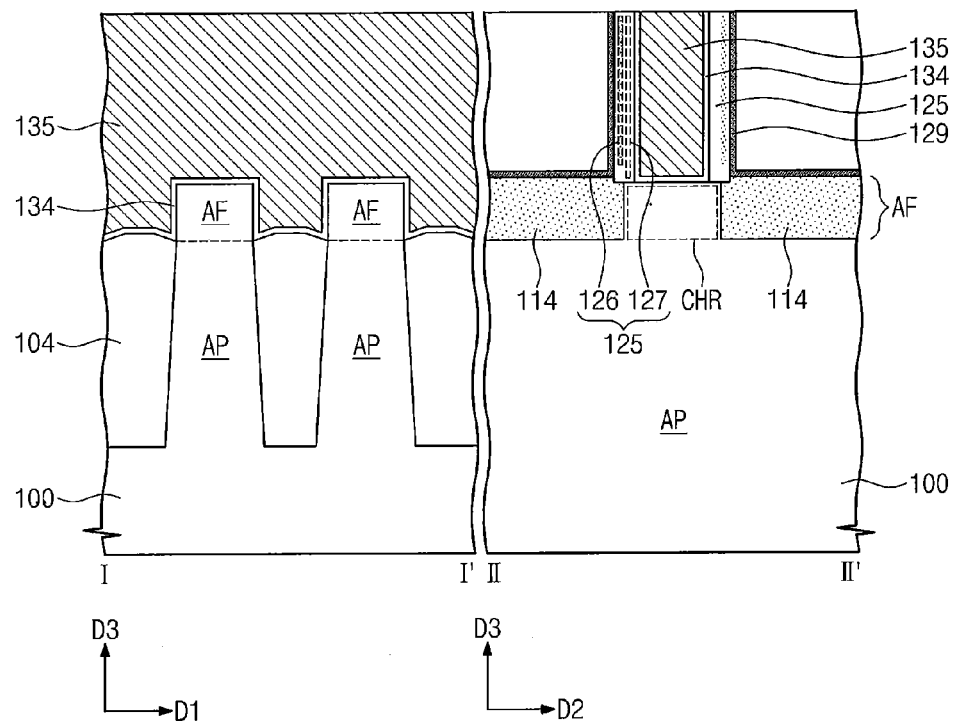

Referring to FIG. 9D, the sacrificial gate pattern 106 may be removed to form a gate trench (not shown) (e.g., see FIG. 3F). The gate trench may be formed to expose the active fins AF.

The gate dielectric layer 134 and the gate electrode 135 may be formed in the gate trench (not shown). The gate dielectric layer 134 may be formed to conformally cover the gate trench. Thereafter, a gate electrode layer (not shown) may be formed on the gate dielectric layer 134 to fill the gate trench, and the gate electrode layer and the gate dielectric layer 134 may be planarized to expose the top surface of the first interlayer insulating layer 150.

Referring back to FIGS. 7 and 8, the top portion of the gate electrode 135 may be recessed, and the gate capping layer 145 may be formed on the gate electrode 135 (e.g., see FIG. 3G).

The second interlayer insulating layer 155 may be formed on the first interlayer insulating layer 150 and the gate capping layer 145. Next, contact holes (not shown) may be formed to penetrate the second interlayer insulating layer 155 and the first interlayer insulating layer 150 and to expose the top surfaces of the source/drain regions 114 (e.g., see FIG. 3H). The formation of the contact holes may be performed to partially remove the etch stop layer 129 on the source/drain regions 114. The remaining portion of the etch stop layer 129 may remain on the spacers 125 and the device isolation layer 104. Accordingly, at least one of the contact holes may be formed to expose the etch stop layer 129 on the sidewall of the spacer 125 and/or the top surface of the second portion 126.

Thereafter, the metal silicide layers 116 may be formed on the source/drain regions 114 exposed by the contact holes. The formation of the metal silicide layers 116 may include forming a metal layer on the source/drain regions 114 and performing a thermal treatment process on the metal layer to form a metal-silicide layer.

The contacts 165 may be formed in the contact holes to be in contact with the metal silicide layers 116. The contacts 165 may be formed in a self-aligned manner by the spacers 125. The interconnection lines 190 may be formed on the second interlayer insulating layer 155 and may be electrically connected to the contacts 165.

Figure 10:
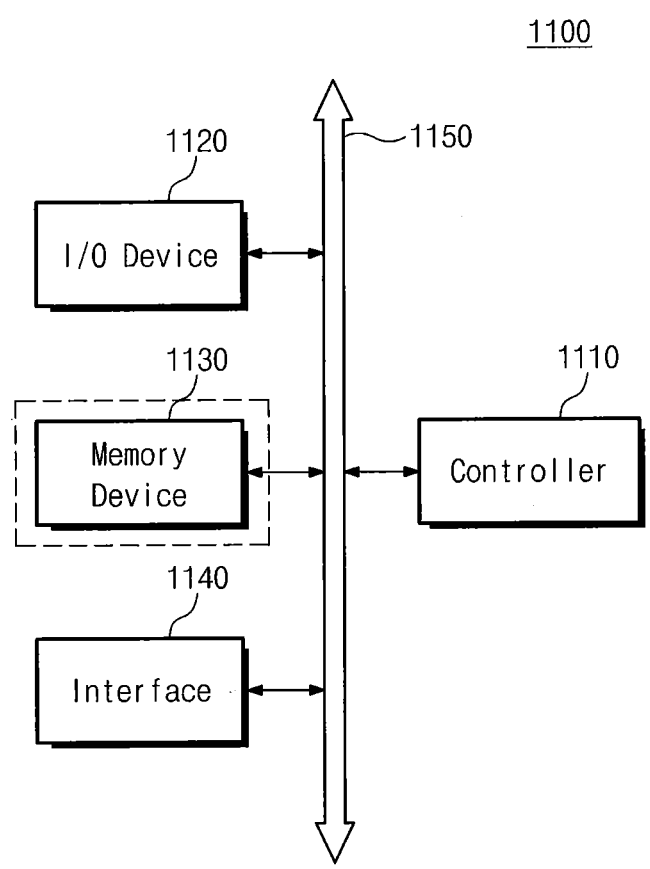
FIG. 10 is a block diagram illustrating an example of an electronic system including a semiconductor device, according to example embodiments of the inventive concept.

FIG. 10 is a block diagram illustrating an example of an electronic system including a semiconductor device according to example embodiments of the inventive concept.

Referring to FIG. 10, an electronic system 1100 according to example embodiments of the inventive concept may include a controller 1110, an input-output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and/or another logic device, which is configured to have a similar function to them. The I/O unit 1120 may include a keypad, a keyboard, and/or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with the semiconductor device according to example embodiments of the inventive concept. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. A semiconductor device according to example embodiments of the inventive concept may be provided as a part of the controller 1110 or the I/O unit 1120. Although not shown in the drawings, the electronic system 1100 may further include a fast DRAM device and/or a fast SRAM device that acts as a cache memory for improving an operation of the controller 1110.

Figure 11:
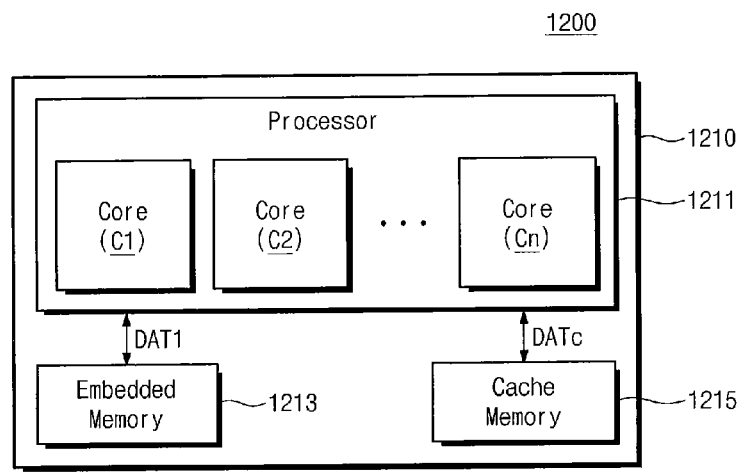
FIG. 11 is a block diagram illustrating an example of an electronic device including a semiconductor device, according to example embodiments of the inventive concept.

FIG. 11 is a block diagram illustrating an example of an electronic device including a semiconductor device according to example embodiments of the inventive concept.

Referring to FIG. 11, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may be configured to include the semiconductor device according to example embodiments of the inventive concept (for example, the plurality of logic cells described with reference to FIG. 5).

The electronic device 1200 may be configured to perform its own functions using the processed data and signals. As an example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be used for a buffering operation on first data DAT1. In other words, the embedded memory 1213 may be operated as a buffer memory or a working memory for the processor 1211.

In example embodiments, the electronic device 1200 may be used to realize a wearable electronic device. In general, the wearable electronic device may be configured to perform an operation of calculating a small amount of data, rather than calculating a large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it is possible for the electronic device 1200 to have a small size and a fast operating speed. Furthermore, in the case where the SRAM is embedded in the semiconductor chip 1210, it is possible to reduce an active power of the electronic device 1200. As an example, the SRAM may include at least one of the semiconductor devices according to example embodiments of the inventive concept.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including the semiconductor device according to example embodiments of the inventive concept. In the case where the cache memory 1215 is used, it is possible to reduce an access frequency or an access time to the embedded memory 1213 performed by the processor 1211. In other words, the use of the cache memory 1215 may allow the electronic device 1200 to have a fast operating speed.

To provide better understanding of example embodiments of the inventive concept, the cache memory 1215 is illustrated in FIG. 11 to be a component separated from the processor 1211. However, the cache memory 1215 may be configured to be included in the processor 1211. In addition, example embodiments of the inventive concept are not limited to the example illustrated by FIG. 11.

The processor 1211, the embedded memory 1213, and the cache memory 1215 may be configured to exchange and/or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), and/or Universal Flash Storage (UFS).

Figure 12:
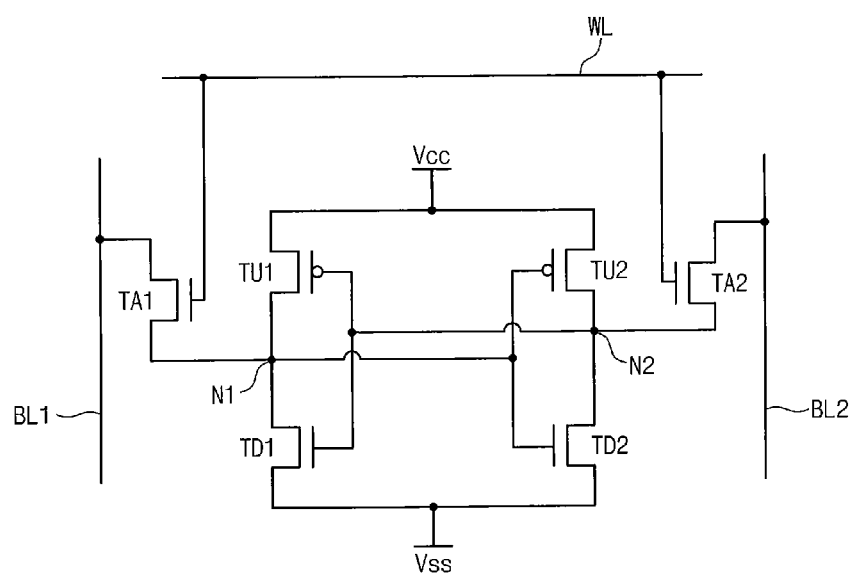
FIG. 12 is an equivalent circuit diagram illustrating an SRAM cell according to example embodiments of the inventive concept.

FIG. 12 is an equivalent circuit diagram illustrating an SRAM cell according to example embodiments of the inventive concept. The SRAM cell may be realized by at least one of the semiconductor devices according to example embodiments of the inventive concept. The SRAM cell may be used for the embedded memory 1213 and/or the cache memory 1215 of FIG. 11.

Referring to FIG. 12, the SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, whereas the first and second pull-down transistors TD1 and TD2 and the first and second access transistors TA1 and TA2 may be NMOS transistors.

A first source/drain of the first pull-up transistor TU1 and a first source/drain of the first pull-down transistor TD1 may be connected to a first node N1. A second source/drain of the first pull-up transistor TU1 may be connected to a power line Vcc, and a second source/drain of the first pull-down transistor TD1 may be connected to a ground line Vss. A gate of the first pull-up transistor TU1 and a gate of the first pull-down transistor TD1 may be electrically connected to each other. Accordingly, the first pull-up transistor TU1 and the first pull-down transistor TD1 may constitute a first inverter. The mutually-connected gates of the first pull-up transistor TU1 and the first pull-down transistor TD1 may serve as an input terminal of the first inverter, and the first node N1 may serve as an output terminal of the first inverter.

A first source/drain of the second pull-up transistor TU2 and a first source/drain of the second pull-down transistor TD2 may be connected to a second node N2. A second source/drain of the second pull-up transistor TU2 may be connected to the power line Vcc, and a second source/drain of the second pull-down transistor TD2 may be connected to the ground line Vss. A gate of the second pull-up transistor TU2 and a gate of the second pull-down transistor TD2 may be electrically connected to each other. Accordingly, the second pull-up transistor TU2 and the second pull-down transistor TD2 may constitute a second inverter. The mutually-connected gates of the second pull-up transistor TU2 and the second pull-down transistor TD2 may serve as an input terminal of the second inverter, the second node N2 may serve as an output terminal of the second inverter.

The first and second inverters may be coupled with each other to form a latch structure. In other words, the gates of the first pull-up transistor TU1 and the first pull-down transistor TD1 may be electrically connected to the second node N2, and the gates of the second pull-up and second pull-down transistors TU2 and TD2 may be electrically connected to the first node N1. The first source/drain of the first access transistor TA1 may be connected to the first node N1, and the second source/drain of the first access transistor TA1 may be connected to a first bit line BL1. The first source/drain of the second access transistor TA2 may be connected to the second node N2, and the second source/drain of the second access transistor TA2 may be connected to a second bit line BL2. The gates of the first and second access transistors TA1 and TA2 may be electrically coupled to a word line WL. The SRAM cell according to example embodiments of the inventive concept may have the afore-described structure, but example embodiments of the inventive concept are not limited thereto.

Figure 13:
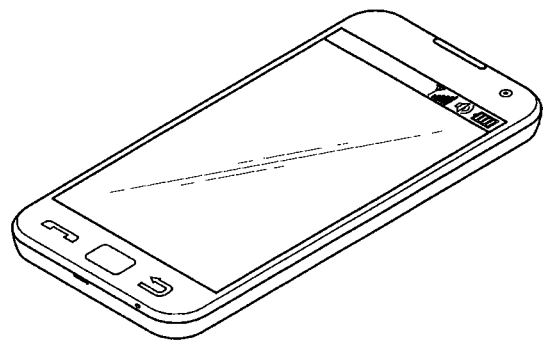
FIGS. 13 through 15 are diagrams illustrating some examples of a multimedia device including a semiconductor device, according to example embodiments of the inventive concept.
Figure 14:
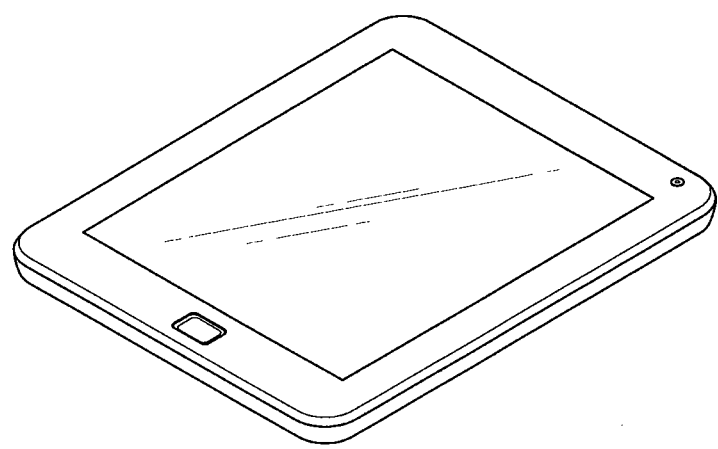
Figure 15:
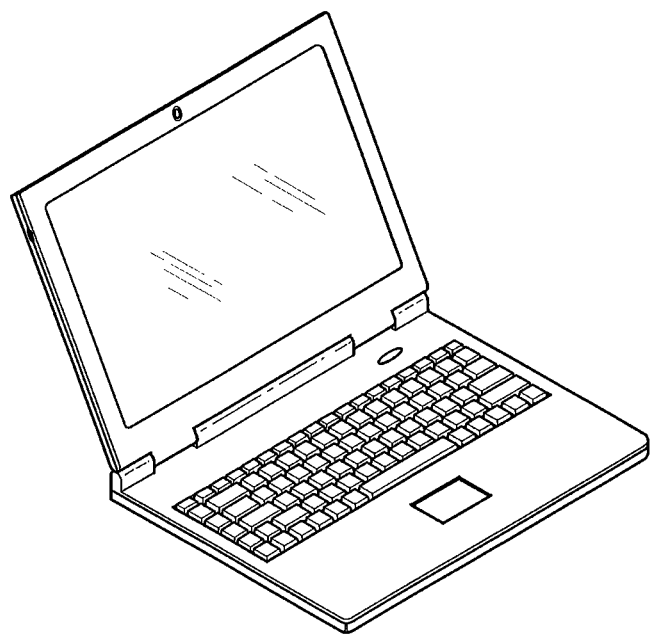

FIGS. 13 through 15 are diagrams illustrating some examples of a multimedia device including a semiconductor device according to example embodiments of the inventive concept. The electronic system 1100 of FIG. 10 and/or the electronic device 1200 of FIG. 11 may be applied to a mobile or smart phone 2000 shown in FIG. 13, to a tablet and/or smart tablet PC 3000 shown in FIG. 14, and/or to a laptop computer 4000 shown in FIG. 15.

According to example embodiments of the inventive concept, methods of fabricating a semiconductor device may include an ion implantation process of injecting silicon ions into spacers disposed on both sidewalls of a pattern, and thus, the spacers can have an increased etch resistant property to a specific etchant. Accordingly, the spacers may be formed of a low-k material, and this makes it possible to improve an RC delay property of the semiconductor device. Furthermore, it is possible to form contacts on both sides of the pattern (e.g., a gate electrode), in a self-aligned manner.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming a gate pattern on a substrate;
    forming a spacer layer on the gate pattern;
    etching the spacer layer to form a spacer on at least one sidewall of the gate pattern;
    performing a silicon ion implantation process on the substrate;
    forming an interlayer insulating layer on the gate pattern and the spacer;
    forming a contact hole in the interlayer insulating layer that exposes the spacer; and
    forming a contact in the contact hole,
    wherein the silicon ion implantation process is performed after forming of the spacer layer and before forming of the contact hole,
    wherein the contact hole exposes a portion of the spacer in which silicon ions are doped,
    wherein the spacer insulates the gate pattern from the contact,
    wherein the silicon ion implantation process forms a first portion and a second portion in the spacer,
    wherein the first portion is positioned adjacent the gate pattern and the second portion is spaced apart from the gate pattern with the first portion interposed therebetween,
    wherein the second portion has a silicon concentration that is higher than a silicon concentration of the first portion, and
    wherein the second portion is used as an etch mask during formation of the contact hole.

2. The method of claim 1, wherein the silicon ion implantation process provides the portion of the spacer in which the silicon ions are doped with a silicon concentration ranging from 30 at % to 40 at %.

3. The method of claim 1, wherein the silicon ion implantation process is performed at a dose ranging from $1.0E14/cm^2$ to $1.0E16/cm^2$.

4. The method of claim 1, wherein an etch selectivity of the second portion with respect to the interlayer insulating layer is higher than an etch selectivity of the first portion with respect to the interlayer insulating layer.

5. The method of claim 1, wherein the second portion serves as an upper region of the spacer, and the second portion has a top surface that is higher than a top surface of the first portion.

6. The method of claim 1, wherein the second portion has a thickness ranging from 2 nm to 20 nm.

7. The method of claim 1, further comprising forming a source/drain region adjacent to the at least one sidewall of the gate pattern,
wherein the contact hole exposes the source/drain region.

8. The method of claim 1, further comprising:
forming trenches in the substrate, the trenches defining active patterns; and
forming device isolation layers that fill the trenches,
wherein the active patterns protrude between the device isolation layers, and
wherein the gate pattern crosses the active patterns.

9. The method of claim 1, wherein the spacer layer is a nitride-based low-k insulating layer that has a dielectric constant that is lower than a dielectric constant of silicon oxide.

10. The method of claim 1, further comprising:
forming a gate capping pattern on the gate pattern; and
forming the interlayer insulating layer on the gate capping pattern and the spacer, wherein the contact hole is formed by etching the interlayer insulating layer using the gate capping pattern as an etch mask.

11. A method of fabricating a semiconductor device, comprising:
forming a gate pattern on a substrate;
forming a spacer layer to cover the gate pattern;
injecting silicon ions into the spacer layer, wherein injection of the silicon ions forms a first portion and a second portion in the spacer layer, wherein the first portion is positioned adjacent to the gate pattern, wherein the second portion is spaced apart from the gate pattern with the first portion interposed therebetween, and wherein the second portion has a silicon concentration that is higher than the silicon concentration in the first portion;
etching the spacer layer to form spacers on sidewalls of the gate pattern;
forming an interlayer insulating layer on the gate pattern and the spacers; and
forming contact holes in the interlayer insulating layer, wherein the second portion is used as an etch mask during formation of the contact holes.

12. The method of claim 11, further comprising:
forming source/drain regions at both sides of the gate pattern before the formation of the interlayer insulating layer,
wherein the interlayer insulating layer is formed on the gate pattern, the spacers and the source/drain regions, and
wherein at least one of the contact holes exposes the second portion.

13. The method of claim 12, wherein the spacer layer is a nitride-based low-k insulating layer that has a dielectric constant that is lower than a dielectric constant of silicon oxide, and
wherein an etch selectivity of the second portion with respect to the interlayer insulating layer that is higher than an etch selectivity of the first portion with respect to the interlayer insulating layer.

14. A method of fabricating a semiconductor device, comprising:
forming a gate pattern on a substrate;
forming a spacer layer on sidewalls of the gate pattern;
injecting silicon ions into the spacer layer;
forming source/drain regions on both sides of the gate pattern;
forming an interlayer insulating layer on the gate pattern, the spacer layer and the source/drain regions;
etching the interlayer insulating layer using the spacer layer as an etch mask to form contact holes that expose the source/drain regions; and
forming contacts that are electrically connected to the source/drain regions in the contact holes,
wherein the spacer layer insulates the gate pattern from the contacts,
wherein injection of the silicon ions into the spacer layer forms a first portion and a second portion in the spacer layer,
wherein the first portion is positioned adjacent the gate pattern and the second portion is spaced apart from the gate pattern with the first portion interposed therebetween, and
wherein the second portion has a silicon concentration that is higher than a silicon concentration of the first portion.

15. The method of claim 14, wherein the injecting of the silicon ions into the spacer layer provides the spacer layer with a silicon concentration ranging from 30 at % to 40 at %.

16. The method of claim 14, further comprising forming spacers on the gate pattern by performing an anisotropic etching process on the spacer layer,
wherein the injecting of the silicon ions into the spacer layer provides the first portion and the second portion in at least one of the spacers, and
wherein at least one of the contact holes exposes the second portion.

17. The method of claim 16, wherein a portion of the second portion serves as an upper region of at least one of the spacers, and the second portion has a top surface that is higher than a top surface of the first portion.

18. The method of claim 14, further comprising:
forming trenches in the substrate, the trenches defining active patterns; and
forming device isolation layers that fill the trenches,
wherein the active patterns protrude between the device isolation layers, and
wherein the gate pattern crosses the active patterns.

19. The method of claim 14, further comprising:
forming an etch stop layer to cover the spacer layer, and injecting the silicon ions into the spacer layer after the forming of the etch stop layer.

* * * * *